US012525887B2

(12) United States Patent
Takahashi

(10) Patent No.: US 12,525,887 B2
(45) Date of Patent: Jan. 13, 2026

(54) POWER CONVERTER

(71) Applicant: Mitsubishi Electric Corporation, Tokyo (JP)

(72) Inventor: Yuya Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 343 days.

(21) Appl. No.: 18/449,991

(22) Filed: Aug. 15, 2023

(65) Prior Publication Data
US 2024/0348174 A1 Oct. 17, 2024

(30) Foreign Application Priority Data

Apr. 13, 2023 (JP) .................................. 2023-065392

(51) Int. Cl.
*H05K 7/20* (2006.01)
*H02M 3/00* (2006.01)
*H02M 3/335* (2006.01)

(52) U.S. Cl.
CPC ....... *H02M 3/33573* (2021.05); *H02M 3/003* (2021.05); *H05K 7/209* (2013.01)

(58) Field of Classification Search
CPC ......... H02M 3/33573; H02M 3/33571; H02M 3/33569; H02M 3/33561; H02M 3/33553; H02M 3/003; H05K 1/11; H05K 1/111; H05K 1/112; H05K 1/113; H05K 1/119; H05K 1/142; H05K 7/209
See application file for complete search history.

(56) References Cited

U.S. PATENT DOCUMENTS

| 2005/0047103 A1* | 3/2005 | Bothe ................. H01F 27/2804 361/803 |
| 2015/0036388 A1 | 2/2015 | Handa et al. |
| 2017/0367178 A1* | 12/2017 | Beyerlein .............. H05K 1/111 |
| 2017/0367185 A1* | 12/2017 | Roessler ............. H05K 3/0047 |

FOREIGN PATENT DOCUMENTS

| JP | 2011182499 A | 9/2011 |
| JP | 2014082894 A | 5/2014 |
| JP | 2015047058 A | 3/2015 |
| JP | 6373454 B1 | 8/2018 |

OTHER PUBLICATIONS

Communication dated Nov. 4, 2025 issued by the Japanese Patent Office in application No. 2023-065392.

* cited by examiner

*Primary Examiner* — Nguyen Tran
(74) *Attorney, Agent, or Firm* — Sughrue Mion, PLLC

(57) ABSTRACT

This power converter includes: a board having a power supply terminal portion; a power module; a control circuit; and a transformer having a winding. The power module has an input terminal, an output terminal, and a control terminal. The power supply terminal portion and the input terminal are connected via the board, the control circuit and the control terminal are connected via the board, and the winding and the output terminal are connected not via the board. The winding has a wound portion, and a lead portion connected to the output terminal. A length in the lead portion from a body portion of the transformer in which the wound portion is stored to a connection portion between the output terminal and the lead portion is greater than a length in the output terminal from a body portion of the power module to the connection portion.

18 Claims, 24 Drawing Sheets

POWER CONVERTER

BACKGROUND

The present disclosure relates to a power converter.

In general, electrified vehicles such as an electric vehicle or a hybrid vehicle, in which a motor is used as a driving source, are provided with a plurality of power converters. Examples of the power converters include an on-vehicle charger which converts commercial AC power to DC power to charge a high-voltage battery, a buck converter which converts DC power of a high-voltage battery to low-voltage DC power and supplies the power to an auxiliary device of a 12 V system in a vehicle, and an inverter which converts DC power from a battery to AC power for a motor. In recent years, for spreading electrified vehicles and enlarging a vehicle-compartment space, the above power converters have been required to be reduced in size and cost, and switching elements provided to the power converters have been increasingly configured as a power module.

By configuring a plurality of switching elements as one power module, size reduction of the power converters and improvement in cooling performance of the switching elements can be achieved. The power module has a control terminal to which a control signal for controlling driving of the switching element is inputted, and a power terminal through which main circuit current flows. These terminals are connected to a board and then connected to another electric component via a wiring pattern provided to the board. In particular, in a case where the power module is used for a circuit on the primary side of the buck converter or the in-vehicle charger, etc., and the main circuit current is about ten and several A, it is general that the terminals are connected to a board and then connected to another electric component via a wiring pattern on the board.

However, the main circuit current flowing through the power terminal is extremely greater than current flowing through a control circuit, and therefore loss and temperature increase in a pattern through which the main circuit current flows might become a problem. Further, in a pattern whose potential varies at a high frequency, e.g., a pattern connected to a transformer, loss occurs also in a part other than a DC resistor, and therefore loss and temperature increase in the pattern particularly become a problem. Specifically, in a case where patterns connected to a transformer are arranged so as to be overlaid between layers of a board, loss occurs due to charging/discharging of a parasitic capacitance generated by overlaid patterns. In a case where patterns connected to a transformer are arranged in parallel, a high-frequency resistance increases due to a proximity effect, so that loss in the patterns increases.

In order to reduce loss due to the pattern as described above, it is necessary to reduce the impedance of the pattern. The means therefor is to increase the pattern width or increase the thickness of the pattern. If the pattern width is increased, the area of the board is enlarged, so that the cost of the board increases. If the thickness of the pattern is increased, copper of the pattern of the board becomes thick or the number of layers of the board increases, so that the cost of the board increases.

A power conversion device in which a wiring member is added for connecting a power terminal of a power module and an electric component at a connection destination and thus main circuit patterns on a board are decreased, is disclosed (for example, Patent Document 1). In Patent Document 1, connection between the power terminal of the power module and a terminal of a transformer which is an electric component is made by adding a busbar which is a wiring member. Although connection between the power terminal and the terminal of the transformer would be originally made by a pattern on the board, the connection pattern originally provided on the board can be removed by adding the busbar, whereby size reduction of the board is achieved.

Patent Document 1: Japanese Patent No. 6373454

In Patent Document 1, since the connection pattern on the board can be removed, the size of the board can be reduced. However, in the configuration in Patent Document 1, since the busbar which is a wiring member is added for removing the pattern on the board, there is a problem that the cost greatly increases. In addition, although the pattern for connection wiring is removed from the board by providing the busbar, the power terminal and the terminal of the transformer are connected to the board and thus insulation distances are needed around the power terminal and the terminal of the transformer. Therefore, other main circuit components and a control circuit cannot be located around the power terminal and the terminal of the transformer. Accordingly, the main circuit components and the control circuit are located with insulation distances ensured, thus having a problem of increasing the size of the board.

SUMMARY

Considering the above, an object of the present disclosure is to provide a power converter in which main circuit patterns on a board are decreased while cost increase due to an additional component is suppressed, thus achieving size reduction and cost reduction.

A power converter according to the present disclosure includes: a board having a power supply terminal portion electrically connected to an external power supply; a power module having a plurality of switching elements and connected to the power supply terminal portion; a control circuit which is provided to the board and controls the power module; and a transformer arranged side by side with the power module and having a winding connected to the power module. The power module has an input terminal electrically connected to the power supply terminal portion, an output terminal electrically connected to the winding, and a control terminal electrically connected to the control circuit. The power supply terminal portion and the input terminal are connected via the board, the control circuit and the control terminal are connected via the board, and the winding and the output terminal are connected not via the board. The winding has a wound portion, and a lead portion extending from the wound portion toward the output terminal and connected to the output terminal. A length in the lead portion from a body portion of the transformer in which the wound portion is stored to a connection portion between the output terminal and the lead portion is greater than a length in the output terminal from a body portion of the power module to the connection portion.

The power converter according to the present disclosure includes: the board having the power supply terminal portion; the power module connected to the power supply terminal portion; the control circuit which is provided to the board and controls the power module; and the transformer arranged side by side with the power module and having the winding connected to the power module. The power module has the input terminal electrically connected to the power supply terminal portion, the output terminal electrically connected to the winding, and the control terminal electrically connected to the control circuit. The power supply terminal portion and the input terminal are connected via the board, the control circuit and the control terminal are connected via the board, and the winding and the output terminal are connected not via the board. The winding has the wound portion, and the lead portion extending from the wound portion toward the output terminal and connected to the output terminal. The length in the lead portion from the body portion of the transformer in which the wound portion is stored to the connection portion between the output terminal and the lead portion is greater than the length in the output terminal from the body portion of the power module to the connection portion. Thus, a main circuit pattern connecting the lead portion and the output terminal can be removed from the board, whereby the size and the cost of the board can be reduced. Since the size and the cost of the board are reduced, the size and the cost of the power converter can be reduced. Since an additional component is not needed for connection between the lead portion and the output terminal, cost increase due to an additional component can be suppressed. Since the lead portion extends toward the output terminal, there is no additional component, cost increase is suppressed, and the size and the cost of the board can be significantly reduced, whereby size reduction and cost reduction of the power converter can be achieved.

DETAILED DESCRIPTION OF THE EMBODIMENTS

Figure 1:
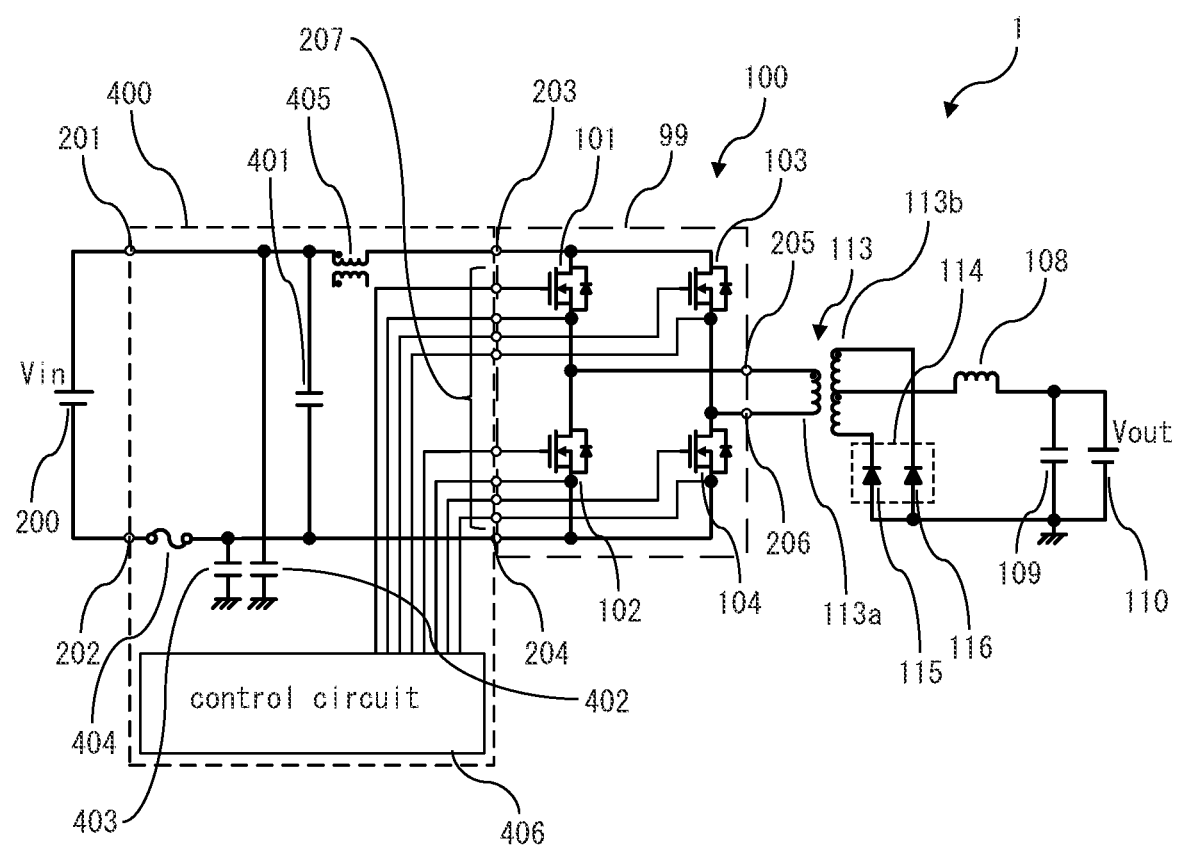
FIG. 1 shows a circuit configuration of a power converter according to the first embodiment of the present disclosure.

Hereinafter, a power converter according to embodiments of the present disclosure will be described with reference to the drawings. In the drawings, the same or corresponding members and parts are denoted by the same reference characters, to give description.

First Embodiment

Figure 2:
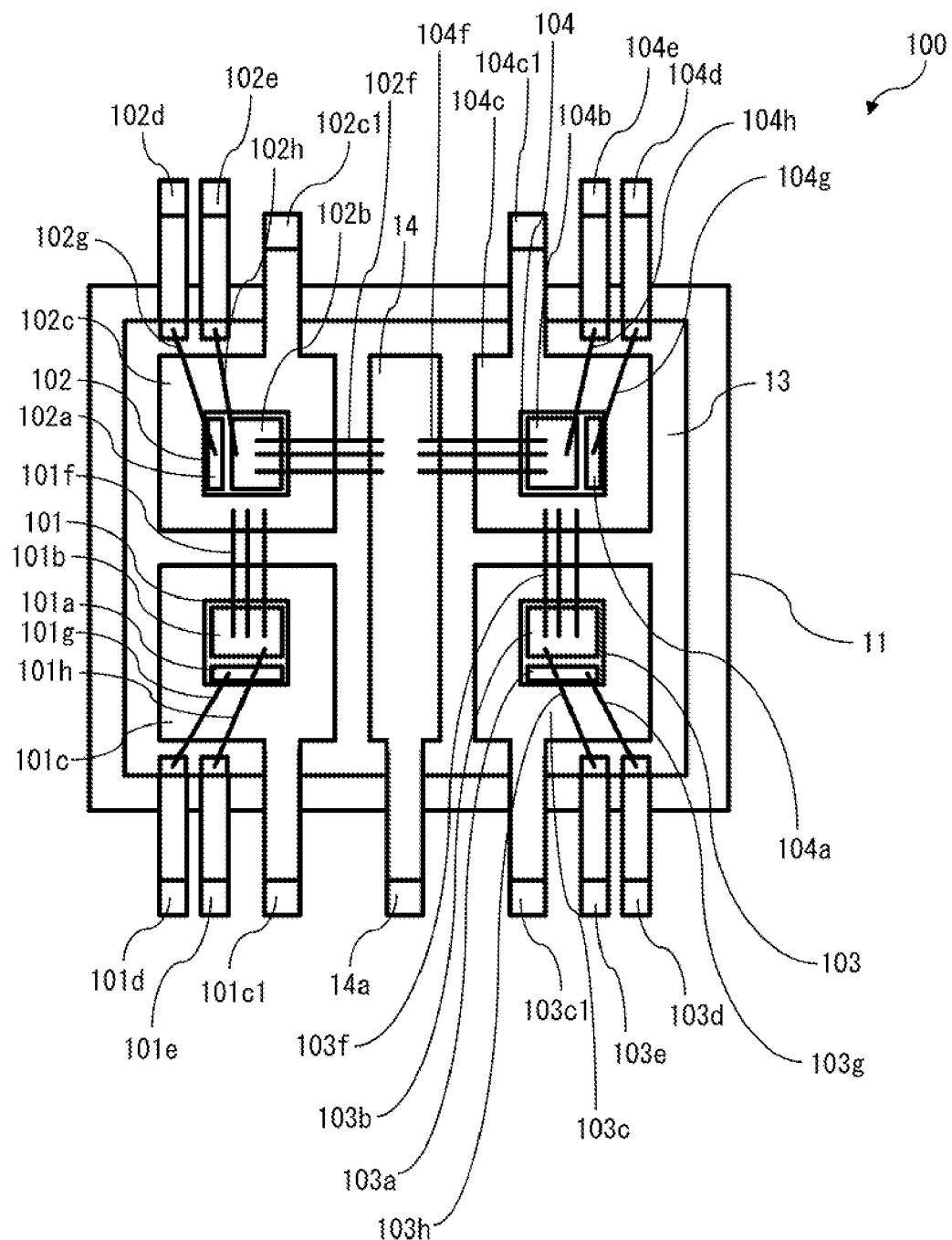
FIG. 2 is a plan view of a power module of the power converter according to the first embodiment.
Figure 3:
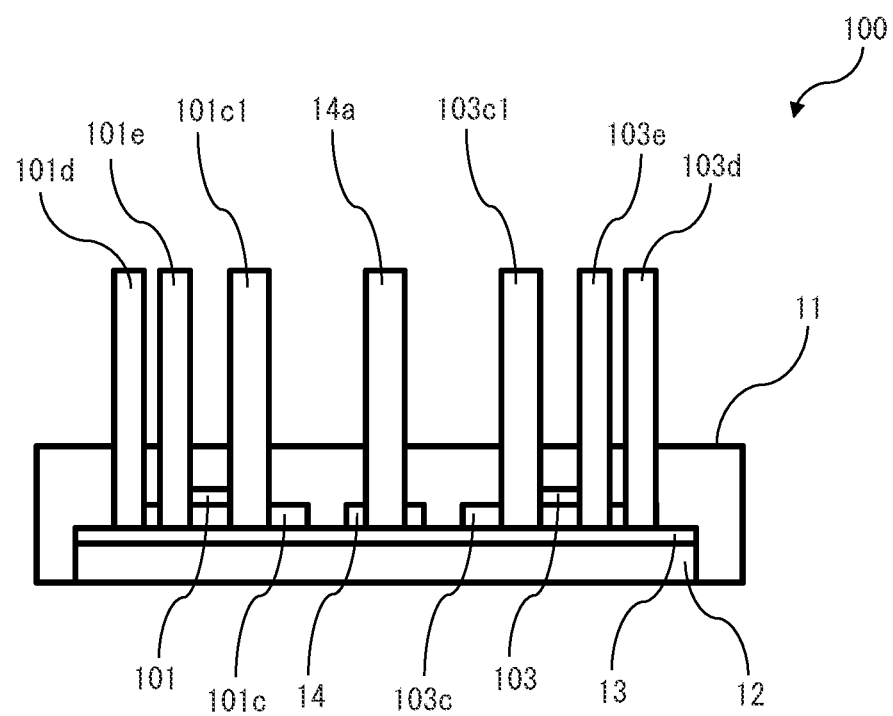
FIG. 3 is a side view of the power module of the power converter according to the first embodiment.
Figure 4:
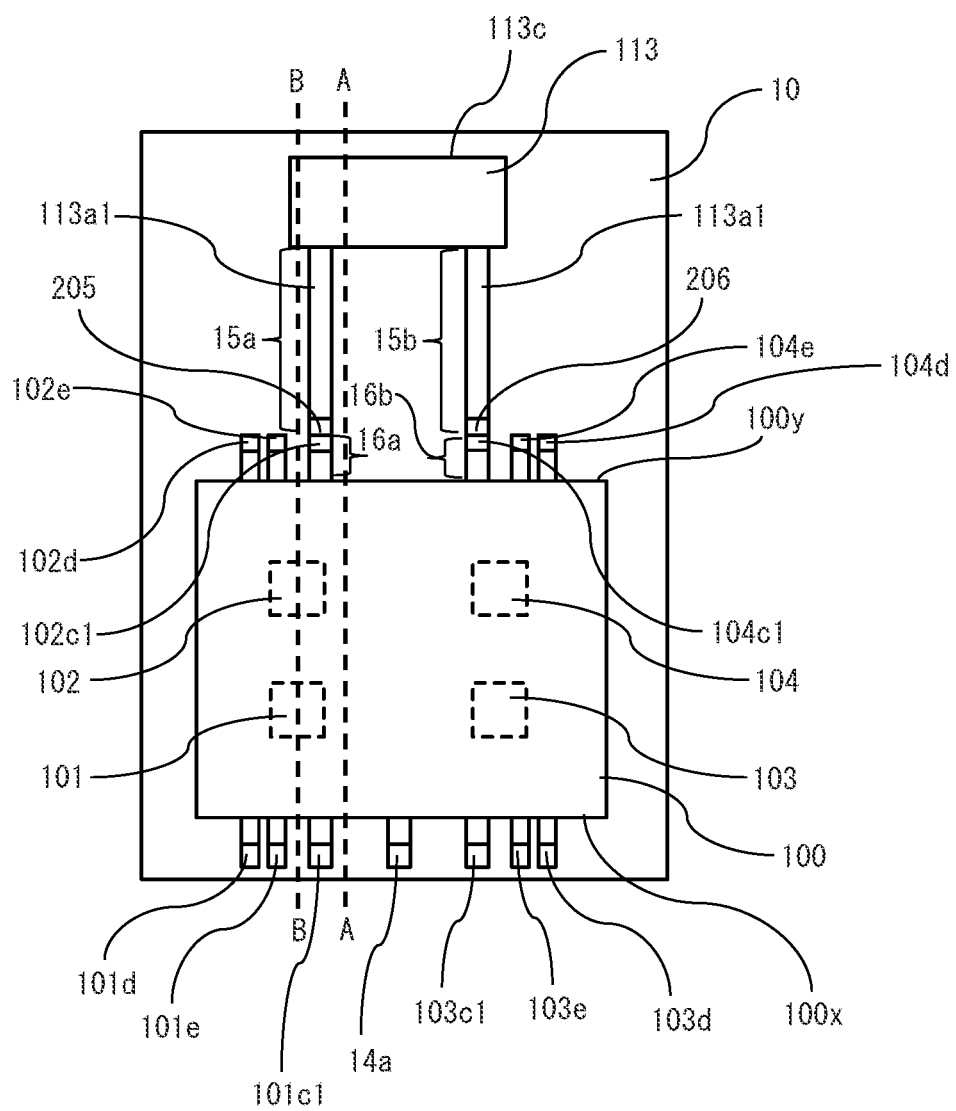
FIG. 4 is a plan view of the power converter according to the first embodiment.
Figure 5:
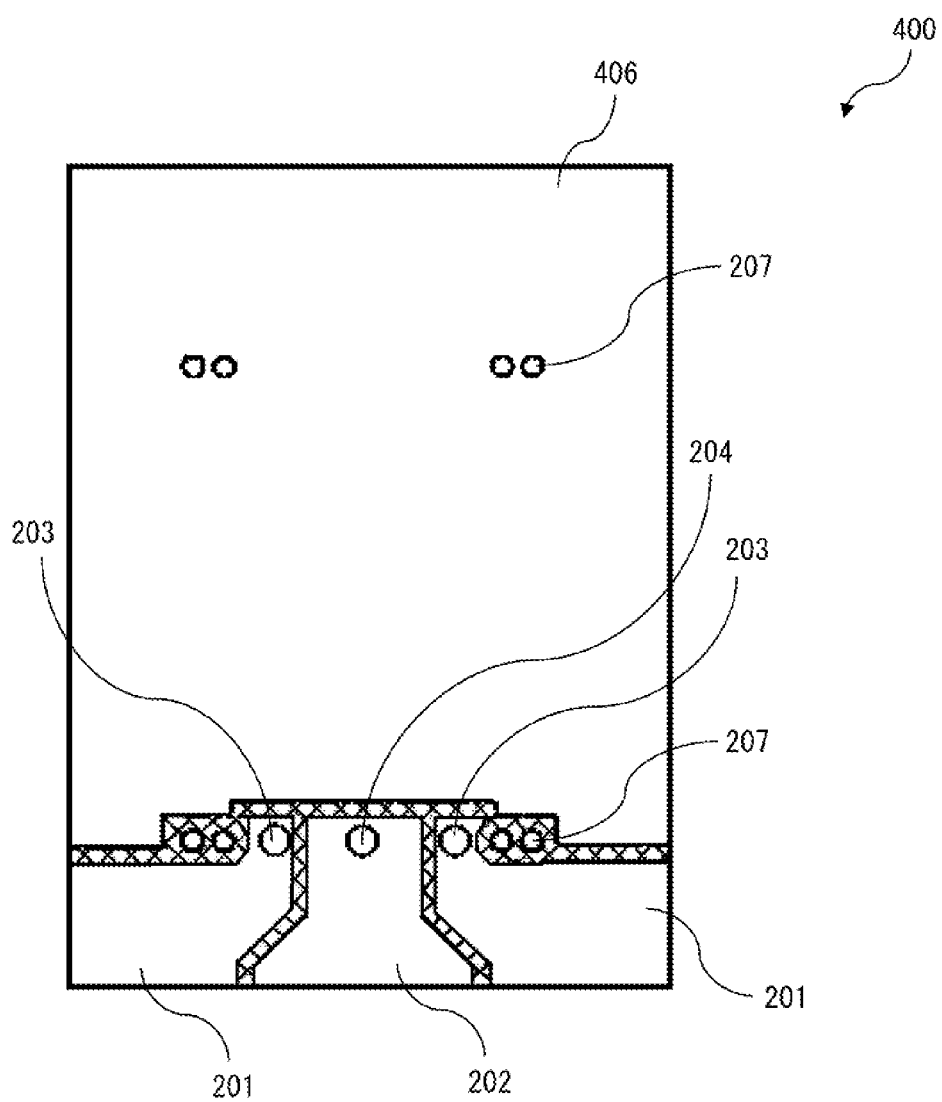
FIG. 5 is a plan view showing a pattern of a board of the power converter according to the first embodiment.
Figure 6:
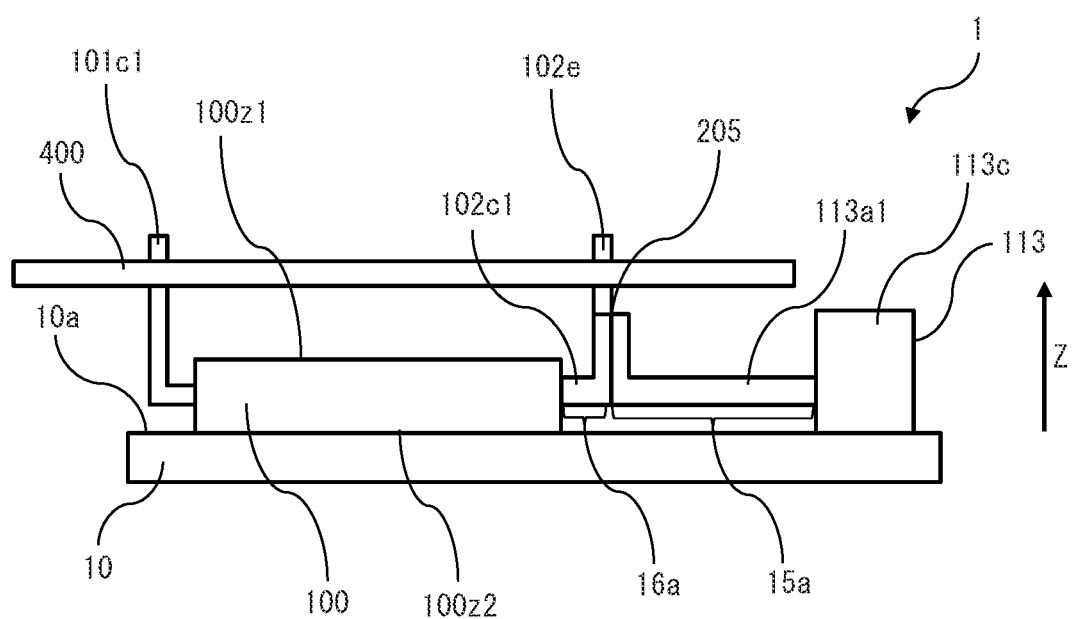
FIG. 6 is a sectional view of the power converter taken at an A-A cross-section position in FIG. 4.

FIG. 1 shows a circuit configuration of a power converter 1 according to the first embodiment of the present disclosure. FIG. 2 is a plan view of a power module 100 of the power converter 1 in a state in which resin 11 is removed and for the resin 11, only an outer shape is shown. FIG. 3 is a side view of the power module 100 of the power converter 1 in a state in which the resin 11 is removed and for the resin 11, only an outer shape is shown. FIG. 4 is a plan view of the power converter 1 in a state in which a board 400 is removed. FIG. 5 is a plan view showing a pattern of the board 400 of the power converter 1. FIG. 6 is a sectional view of the power converter 1 taken at an A-A cross-section position in FIG. 4. In the present embodiment, a case where the power converter 1 is an isolation DC/DC converter will be described as an example, but the power converter 1 is not limited to a DC/DC converter.

<Power Converter 1>

An example of the circuit configuration of the power converter 1 which is an isolation DC/DC converter will be described with reference to FIG. 1. In the power converter 1, the input side and the output side are isolated via a transformer 113. In FIG. 1, the left side is the input side and the right side is the output side. The power converter 1 is a device that converts input voltage Vin of a DC power supply 200 which is an external power supply, to secondary-side DC voltage isolated via the transformer 113, and outputs output voltage Vout to a load 110 such as a battery.

The power converter 1 includes an inverter circuit 99 and a rectification circuit 114 at parts enclosed by broken lines in FIG. 1. The inverter circuit 99 is a circuit stored in the power module 100 described later. The inverter circuit 99 is a circuit that converts the input voltage Vin from the DC power supply 200 to AC voltage and has switching elements 101, 102, 103, 104 connected in a bridge form. The inverter circuit 99 is connected to a primary-side winding 113a of the transformer 113 on the output side. The rectification circuit 114 is a circuit connected to a secondary-side winding 113b of the transformer 113 and having diodes 115, 116 as rectification elements. The rectification circuit 114 rectifies output of the transformer 113, to perform conversion to DC pulse voltage. A smoothing reactor 108 and an output capacitor 109 are connected to the output side of the rectification circuit 114, and the output voltage Vout is outputted to the load 110. The smoothing reactor 108 and the output capacitor 109 smooth the DC pulse voltage.

Between the DC power supply 200 and the inverter circuit 99, an X capacitor 401, Y capacitors 402, 403, a fuse 404, and a current sensor 405 are connected. The X capacitor 401 and the Y capacitors 402, 403 are noise coping components for coping with noise in a normal mode and a common mode. A control circuit 406 outputs driving signals to the switching elements 101 to 104 in accordance with the condition so that the output voltage Vout reaches a target value, to control ON duties (ON periods) of the switching elements 101 to 104, thus performing PWM control.

In FIG. 1, a configuration at a part enclosed by a broken line on the left side is provided at one board 400. The board 400 is a glass epoxy board, for example. At the board 400, power supply terminal portions 201, 202 which are connection portions with the positive side and the negative side of the DC power supply 200, a positive-side connection portion 203 and a negative-side connection portion 204 which are connection portions with input terminals on the positive side and the negative side of the power module 100, and control-side connection portions 207 which are connection portions with control terminals, are provided. At connection portions 205, 206 between the transformer 113 and output terminals of the power module 100, connection is made directly not via the board 400.

As the switching elements 101 to 104, a metal oxide semiconductor field effect transistor (MOSFET) which is a self-turn-off semiconductor switching element made from silicon (Si) and includes a diode between the source and the drain, is used. The switching element is not limited to the MOSFET. The switching element may be an insulated gate bipolar transistor (IGBT) to which a diode is connected in antiparallel, or the like. The material of the switching element is not limited to silicon (Si), and the switching element may be made from a wide bandgap semiconductor material such as silicon carbide (SiC) or gallium nitride (GaN), or a diamond-based semiconductor material.

<Power Module 100>

An example of a mounting configuration of the power module 100 will be described with reference to FIG. 2 and FIG. 3. In FIG. 3, bonding wires are not shown. As shown in FIG. 2, the power module 100 has five lead frames 101c to 104c, 14. The lead frames are copper plates, for example. Each of the switching elements 101 to 104 is a semiconductor chip having a drain pad on the bottom surface and having a gate pad and a source pad on the top surface, for example. The switching elements 101 to 104 are respectively mounted to the lead frames 101c to 104c.

As shown in FIG. 3, the power module 100 includes a cooling plate 12 and an insulation sheet 13. The cooling plate 12 is made of, for example, copper or aluminum which is a metal material having high thermal conductivity. The lead frames 101c to 104c, 14 and control terminals 101d to 104d, 101e to 104e are insulated from the cooling plate 12 via the insulation sheet 13 and are provided on one plate-surface side of the cooling plate 12. As shown in FIG. 2, the lead frames 101c to 104c, 14, the control terminals 101d to 104d, 101e to 104e, the cooling plate 12, and the insulation sheet 13 are integrated by being sealed with the resin 11 in a state in which terminal parts to be connected to the outside of the power module 100 and the plate surface on the other side of the cooling plate 12 are exposed. The terminal parts to be connected to the outside of the power module 100 are respective ends of input terminals 101c1, 103c1, 14a, output terminals 102c1, 104c1, and the control terminals 101d to 104d, 101e to 104e, and hereinafter, are referred to as module terminals. The input terminals 101c1, 103c1, 14a are respective parts of the lead frames 101c, 103c, 14, and the output terminals 102c1, 104c1 are respective parts of the lead frames 102c, 104c. In the present embodiment, each module terminal exposed from the resin 11 extends in a direction parallel to the plate surface of the cooling plate 12 and then is bent to extend in a direction where the board 400 is placed.

The switching element 101 has a gate pad 101a and a source pad 101b on the top surface and is mounted to the lead frame 101c on the drain pad side at the bottom surface. The lead frame 101c has the input terminal 101c1. The input terminal 101c1 is connected to the board 400 at the positive-side connection portion 203 provided to the board 400, and then is connected to the positive side of the DC power supply 200 via the power supply terminal portion 201 which is a wiring pattern on the board 400. The source pad 101b of the switching element 101 is connected to the lead frame 102c via a bonding wire 101f.

The switching element 102 has a gate pad 102a and a source pad 102b on the top surface and is mounted to the lead frame 102c on the drain pad side at the bottom surface. The lead frame 102c has the output terminal 102c1. The output terminal 102c1 is connected to a lead portion 113a1 of the primary-side winding 113a of the transformer 113 at the connection portion 205 not via the board 400. The source pad 102b of the switching element 102 is connected to the lead frame 14 via a bonding wire 102f. The lead frame 14 is provided between: the lead frame 101c and the lead frame 102c; and the lead frame 103c and the lead frame 104c. The lead frame 14 has the input terminal 14a. The input terminal 14a is connected to the board 400 at the negative-side connection portion 204 provided to the board 400, and then is connected to the negative side of the DC power supply 200 via the power supply terminal portion 202 which is a wiring pattern on the board 400.

The switching element 103 has a gate pad 103a and a source pad 103b on the top surface and is mounted to the lead frame 103c on the drain pad side at the bottom surface. The lead frame 103c has the input terminal 103c1. The input terminal 103c1 is connected to the board 400 at the positive-side connection portion 203 provided to the board 400, and then is connected to the positive side of the DC power supply 200 via the power supply terminal portion 201 which is a wiring pattern on the board 400. The source pad 103b of the switching element 103 is connected to the lead frame 104c via a bonding wire 103f.

The switching element 104 has a gate pad 104a and a source pad 104b on the top surface and is mounted to the lead frame 104c on the drain pad side at the bottom surface. The lead frame 104c has the output terminal 104c1. The output terminal 104c1 is connected to a lead portion 113a1 of the primary-side winding 113a of the transformer 113 at the connection portion 206 not via the board 400. The source pad 104b of the switching element 104 is connected to the lead frame 14 via a bonding wire 104f.

The gate pads 101a to 104a of the switching elements 101 to 104 are respectively connected to the control terminals 101d, 102d, 103d, 104d via bonding wires 101g, 102g, 103g, 104g. The control terminals 101d to 104d are connected to the board 400 at the control-side connection portions 207 provided to the board 400, and then are connected to the control circuit 406 mounted to the board 400, via a wiring pattern on the board 400.

The source pads 101b to 104b of the switching elements 101 to 104 are respectively connected to the control terminals 101e, 102e, 103e, 104e via bonding wires 101h, 102h, 103h, 104h. The control terminals 101e to 104e are connected to the board 400 at the control-side connection portions 207 provided to the board 400, and then are connected to the control circuit 406 mounted to the board 400, via a wiring pattern on the board 400. With the above connection, a reference potential for gate driving is measured. Detection for the reference potential for gate driving is not limited to the above. The switching elements 101 to 104 may be provided with pads for gate driving separately from the source pads 101b to 104b, and the pads for gate driving may be respectively connected to the control terminals 101e to 104e via the bonding wires 101h to 104h.

Since both of the input terminals 101c1, 103c1 are terminals connected to the positive side of the DC power supply 200, the input terminal 101c1 and the input terminal 103c1 may be connected on the board 400 outside the power module 100, or may be connected inside the power module 100 via a busbar mounted across the lead frame 14. In this example, the numbers of the bonding wires 101g to 104g for the respective gate pads are one, and the numbers of the bonding wires 101f to 104f for the respective source pads are three. However, the numbers of the bonding wires are not limited to the above. The connection may be made using a busbar, instead of bonding wires.

Comparative Example

Figure 7:
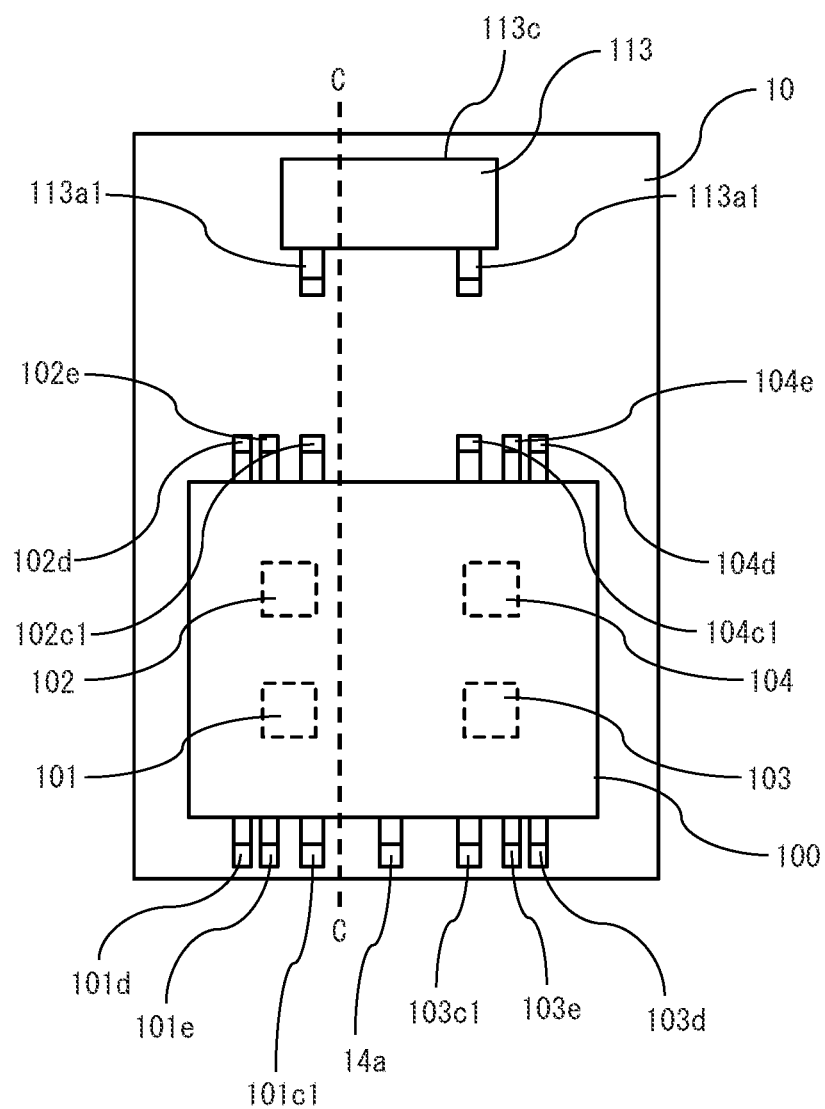
FIG. 7 is a plan view of a power converter in a comparative example.
Figure 8:
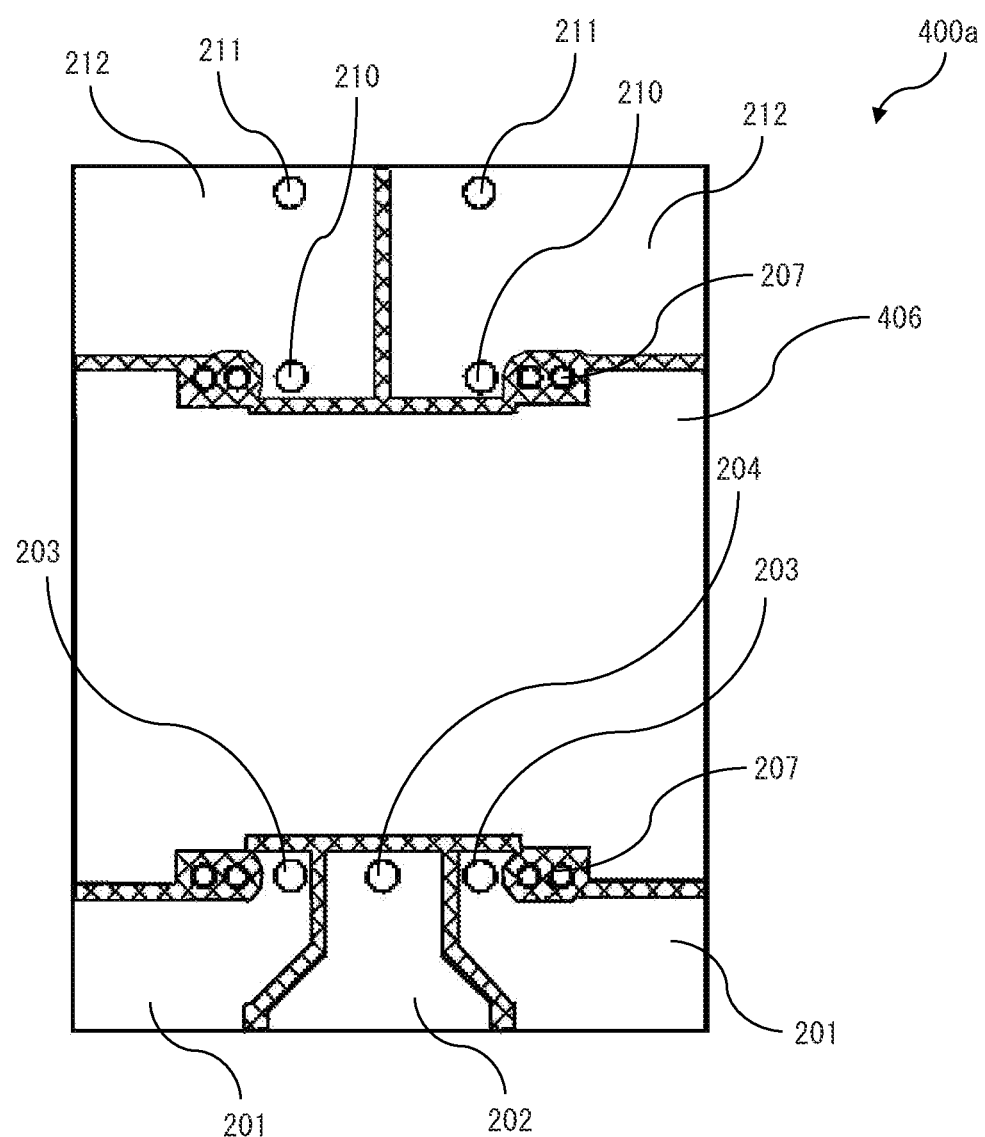
FIG. 8 is a plan view showing a pattern of a board of the power converter in the comparative example.
Figure 9:
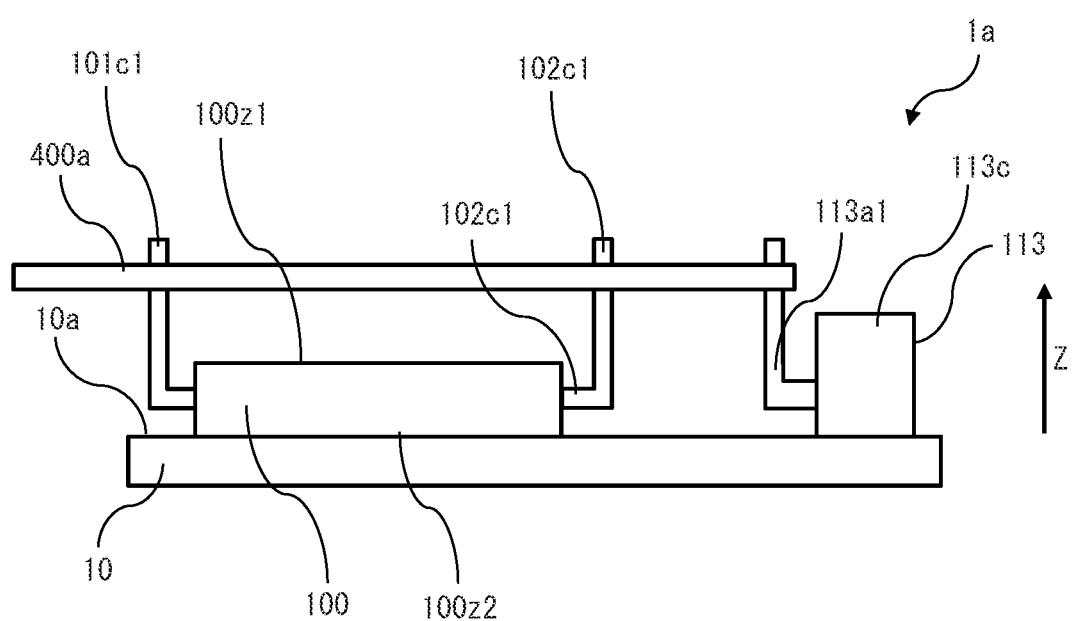
FIG. 9 is a sectional view of the power converter in the comparative example taken at a C-C cross-section position in FIG. 7.

Before description of the configuration of connection between the power module 100 and the transformer 113, which is a major part of the present disclosure, a comparative example will be described with reference to FIG. 7 to FIG. 9. FIG. 7 is a plan view of a power converter 1a in the comparative example in a state in which a board 400a is removed. FIG. 8 is a plan view showing a pattern on the board 400a of the power converter 1a in the comparative example. FIG. 9 is a sectional view of the power converter 1a in the comparative example taken at a C-C cross-section position in FIG. 7.

The power converter 1a includes the power module 100, the board 400a, the control circuit 406 which is provided to the board 400a and controls the power module 100, the transformer 113 arranged side by side with the power module 100 and having a winding connected to the power module 100, and a cooler 10. Parts hatched in FIG. 8 are parts where insulation distances ensured between terminals connected to the board 400a are provided. The control circuit 406 is provided between the parts where insulation distances are provided in FIG. 8. Specific components forming the control circuit 406 are not shown. The configuration of the power module 100 is equivalent to that shown in FIG. 2, except for the configuration of connection of the output terminals 102c1, 104c1 with the transformer 113. In the comparative example, the output terminals 102c1, 104c1 are connected to the board 400a at module connection portions 210 provided to the board 400a. The lead portions 113a1 of the primary-side winding 113a of the transformer 113 are connected to the board 400a at transformer connection portions 211 provided to the board 400a. The module connection portions 210 and the transformer connection portions 211 are connected via connection portions 212 which are main circuit patterns on the board 400a.

The main circuit patterns connecting the lead portions 113a1 of the primary-side winding 113a and the output terminals 102c1, 104c1 are patterns whose potentials vary at a high-frequency, and therefore need to have great board pattern widths. As shown in FIG. 8, an area corresponding to approximately ¼ of the board 400a is used as the main circuit patterns connecting the lead portions 113a1 and the output terminals 102c1, 104c1. In addition, since insulation distances are needed around the lead portions 113a1 and the output terminals 102c1, 104c1, other main circuit components and the control circuit 406 cannot be located around the module connection portions 210 and the transformer connection portions 211. Accordingly, the main circuit components and the control circuit 406 are located at the board 400a with insulation distances ensured, so that the size of the board 400a might become larger than the size shown in FIG. 8.

<Configuration of Connection Between Power Module 100 and Transformer 113>

A specific example of the configuration of the power converter 1 in the present disclosure, and the configuration of connection between the power module 100 and the transformer 113, which is a major part of the present disclosure, will be described with reference to FIG. 4 to FIG. 6. The power converter 1 includes the board 400 having the power supply terminal portions 201, 202 electrically connected to the DC power supply 200 which is an external power supply, the power module 100 having the plurality of switching elements 101 to 104 and connected to the power supply terminal portions 201, 202, the control circuit 406 which is provided to the board 400 and controls the power module 100, and the transformer 113 arranged side by side with the power module 100 and having the primary-side winding 113a which is a winding connected to the power module 100. As shown in FIG. 6, the power module 100 is located with a gap provided from a board surface of the board 400. A direction perpendicular to the board surface and extending from the power module 100 toward the board 400 is defined as a Z direction. As seen in the Z direction, the board 400 is located so as to overlap the power module 100 and partially overlap the lead portion 113a1. Parts hatched in FIG. 5 are parts where insulation distances ensured between terminals connected to the board 400 are provided. The control circuit 406 is located on the upper side relative to the parts where insulation distances are provided in FIG. 5. Specific components forming the control circuit 406 are not shown.

In the present embodiment, the power converter 1 further includes a cooler 10 for cooling the power module 100, and the power module 100 is thermally connected to a cooling surface 10a of the cooler 10. In the present embodiment, the transformer 113 is also thermally connected to the cooling surface 10a. The cooler 10 is made of, for example, copper or aluminum which is a metal material having high thermal conductivity. A coolant flows inside the cooler 10. The coolant may be liquid such as cooling water, or may be gas.

The power module 100 has the input terminals 101c1, 103c1, 14a electrically connected to the power supply terminal portions 201, 202, the output terminals 102c1, 104c1 electrically connected to the primary-side winding 113a, and the control terminals 101d to 104d, 101e to 104e electrically connected to the control circuit 406. The power supply terminal portions 201, 202 and the input terminals 101c1, 103c1, 14a are connected via the board 400, the control circuit 406 and the control terminals 101d to 104d, 101e to 104e are connected via the board 400, and the primary-side winding 113a and the output terminals 102c1, 104c1 are connected not via the board 400.

The primary-side winding 113a has a wound portion (not shown), and the lead portions 113a1 extending from the wound portion toward the output terminals 102c1, 104c1 and respectively connected to the output terminals 102c1, 104c1. As shown in FIG. 4, a length 15a in the lead portion 113a1 from a body portion 113c of the transformer 113 in which the wound portion is stored to the connection portion 205 between the output terminal 102c1 and the lead portion 113a1 is greater than a length 16a in the output terminal 102c1 from a body portion of the power module 100 to the connection portion 205. Similarly, a length 15b in the lead portion 113a1 from the body portion 113c of the transformer 113 in which the wound portion is stored to the connection portion 206 between the output terminal 104c1 and the lead portion 113a1 is greater than a length 16b in the output terminal 104c1 from the body portion of the power module 100 to the connection portion 206. The body portion of the power module 100 is a part sealed with the resin 11, of the power module 100.

Since the lead portions 113a1 extend toward the output terminals 102c1, 104c1, and the lead portion 113a1 and the output terminals 102c1, 104c1 are connected not via the board 400, main circuit patterns connecting the lead portions 113a1 and the output terminals 102c1, 104c1 and an area for ensuring insulation distances between the output terminals 102c1, 104c1 and the surroundings, can be removed from the board 400. As compared to patterns for the control circuit, the main circuit patterns need to have significantly greater pattern widths because of difference in the flowing current amount, as shown in FIG. 8. Therefore, when the main circuit patterns are removed from the board 400, the degree of freedom in layout of the control circuit 406 mounted on the same board 400 is improved, so that it becomes possible to arrange the control circuit 406 with high efficiency without waste. In addition to size reduction of the board 400 by an amount corresponding to the area of the main circuit patterns that would be originally present, owing to arrangement of the control circuit 406 with high efficiency without waste, the size and the cost of the board 400 can be further reduced. Since the size and the cost of the board 400 are reduced, the size and the cost of the power converter 1 can be reduced. Since an additional component is not needed for connection between the lead portions 113a1 and the output terminals 102c1, 104c1, cost increase due to an additional component can be suppressed.

The connection portions 212 which are the main circuit patterns shown in FIG. 8 are patterns whose potentials vary at a high-frequency. Therefore, in addition to DC loss due to large current specific to the main circuit patterns, loss due to charging/discharging of a parasitic capacitance generated by overlaid patterns and loss due to great increase in the high-frequency resistance based on a proximity effect when patterns are arranged in parallel, are increased. Therefore, the connection portions 212 need to have greater pattern widths than the power supply terminal portions 201, 202. That is, when the connection portions 212 are removed from the board 400, the area that can be removed is larger than when the power supply terminal portions 201, 202 are removed from the board 400. Thus, removing the connection portions 212 from the board 400 can more reduce the size of the board 400.

In a case where, instead of the lead portion 113a1, the output terminals 102c1, 104c1 extend toward the lead portion 113a1, the size of the outermost shape of the lead frames 102c, 104c of the power module 100 is increased. Depending on the degree of the size increase, the constraints on the size in the present equipment might be exceeded, so that new equipment is needed and the cost of the power module 100 is significantly increased. Therefore, since the lead portions 113a1 extend toward the output terminals 102c1, 104c1, there is no additional component, cost increase is suppressed, and the size and the cost of the board 400 can be significantly reduced, whereby size reduction and cost reduction of the power converter 1 can be achieved.

In the present embodiment, the power module 100 is formed in a rectangular parallelepiped shape having a first surface, a second surface on the side opposite to the first surface, and a third surface, a fourth surface, a fifth surface, and a sixth surface which are four surfaces surrounding the first surface and the second surface. As shown in FIG. 6, the power module 100 is thermally connected to the cooling surface 10a at the second surface 100z2. The board 400 is located on the first surface 100z1 side.

The input terminals 101c1, 103c1, 14a are located at one of the third surface 100x and the fourth surface 100y opposed to each other, the output terminals 102c1, 104c1 are located at the other of the third surface 100x and the fourth surface 100y opposed to each other, and the transformer 113 is located on the surface side where the output terminals 102c1, 104c1 are located. As shown in FIG. 4, in the present embodiment, the input terminals 101c1, 103c1, 14a are located at the third surface 100x, and the output terminals 102c1, 104c1 are located at the fourth surface 100y. The transformer 113 is located on the fourth surface 100y side of the power module 100.

With this configuration, the lengths 15a, 15b in the lead portions 113a1 can be reduced. Since the lengths 15a, 15b in the lead portions 113a1 are reduced, the cost of the primary-side winding 113a can be reduced. In addition, the leakage inductance of the transformer 113 can be reduced. Since the leakage inductance of the transformer 113 is reduced, switching loss of the switching elements 101 to 104 can be reduced and surge voltage can be reduced. Thus, the size of the power module 100 can be reduced and the X capacitor 401 can be removed, whereby the size and the cost of the power converter 1 can be further reduced.

In the present embodiment, the board surface of the board 400 is located, with a gap provided from the power module 100, on the side opposite to the cooler 10 side of the power module 100. The connection portions 205, 206 are located in an area between the board 400 and the cooler 10. As shown in FIG. 6, it is desirable that, as seen in the Z direction, the connection portion 205 is located on the power module 100 side relative to the board 400. The same applies to the connection portion 206. As seen in the Z direction, in a case where the connection portions 205, 206 are located on the side opposite to the power module 100 side relative to the board 400, while an effect that the main circuit patterns connecting the lead portions 113a1 and the output terminals 102c1, 104c1 can be removed is still obtained, the connection portions 205, 206 and the board 400 interfere with each other and therefore through holes need to be provided in the board 400 at interference parts. Providing the through holes reduces the effective area of the board 400 where components are mounted. As seen in the Z direction, in a case where the connection portions 205, 206 are located on the power module 100 side relative to the board 400, such through holes are not needed, so that the size of the board 400 can be further reduced.

In the present embodiment, as seen in the Z direction, the output terminals 102c1, 104c1 and at least parts of the lead portions 113a1 are located so as to overlap the board 400, and the lengths of the parts where the lead portions 113a1 overlap the board 400 are greater than the lengths of the parts where the output terminals 102c1, 104c1 overlap the board 400. Since the control circuit 406 is arranged around the control-side connection portions 207, the above configuration makes it possible to ensure a larger area where the control circuit 406 is arranged around the control-side connection portions 207. Therefore, the degree of freedom in layout of the control circuit 406 is improved, so that it becomes possible to arrange the control circuit 406 with high efficiency without waste. In addition to size reduction of the board 400 by an amount corresponding to the area of the main circuit patterns that would be originally present, owing to arrangement of the control circuit 406 with high efficiency without waste, the size and the cost of the board 400 can be further reduced.

In the present embodiment, the plurality of switching elements include a first switching element and a second switching element, and the first switching element and the second switching element are connected in series to each other. A first connection portion at which the first switching element and the second switching element are connected is electrically connected to a first output terminal which is the output terminal. For example, the first switching element is the switching element 101, the second switching element is the switching element 102, the first connection portion is a part where the bonding wire 101f is connected to the lead frame 102c, and the first output terminal is the output terminal 102c1.

When the output terminal 102c1 is a connection point between the switching elements 101, 102 as described above, the effect by removing the main circuit patterns from the board 400 can be increased. When the connection portions 212 are removed from the board 400, the area that can be removed is larger than when the power supply terminal portions 201, 202 are removed from the board 400. Thus, removing the connection portions 212 from the board 400 can more reduce the size of the board 400.

In the present embodiment, the plurality of switching elements include a third switching element and a fourth switching element, the third switching element and the fourth switching element are connected in series to each other, a second connection portion at which the third switching element and the fourth switching element are connected is electrically connected to a second output terminal which is the output terminal, and the first output terminal and the second output terminal are located adjacently to each other. For example, the third switching element is the switching element 103, the fourth switching element is the switching element 104, the second connection portion is a part where the bonding wire 103f is connected to the lead frame 104c, and the second output terminal is the output terminal 104c1. As shown in FIG. 4, the output terminal 102c1 and the output terminal 104c1 are located adjacently to each other with no other terminals located therebetween.

With this configuration, the leakage inductance of the transformer 113 can be reduced. Since the leakage inductance of the transformer 113 is reduced, switching loss of the switching elements 101 to 104 can be reduced and surge voltage can be reduced. Thus, the size of the power module 100 can be reduced and the X capacitor 401 can be removed, whereby the size and the cost of the power converter 1 can be further reduced.

In the present embodiment, the input terminals 101c1, 103c1, 14a extend in the Z direction and are connected to the board 400. With this configuration, the lengths of the input terminals 101c1, 103c1, 14a can be reduced. Since the lengths of the input terminals 101c1, 103c1, 14a are reduced, the resistances of the input terminals 101c1, 103c1, 14a are reduced, so that heat generation in the input terminals 101c1, 103c1, 14a can be suppressed. In addition, since the lengths of the input terminals 101c1, 103c1, 14a are reduced, the cost of the input terminals 101c1, 103c1, 14a can be reduced.

Modification 1

Figure 10:
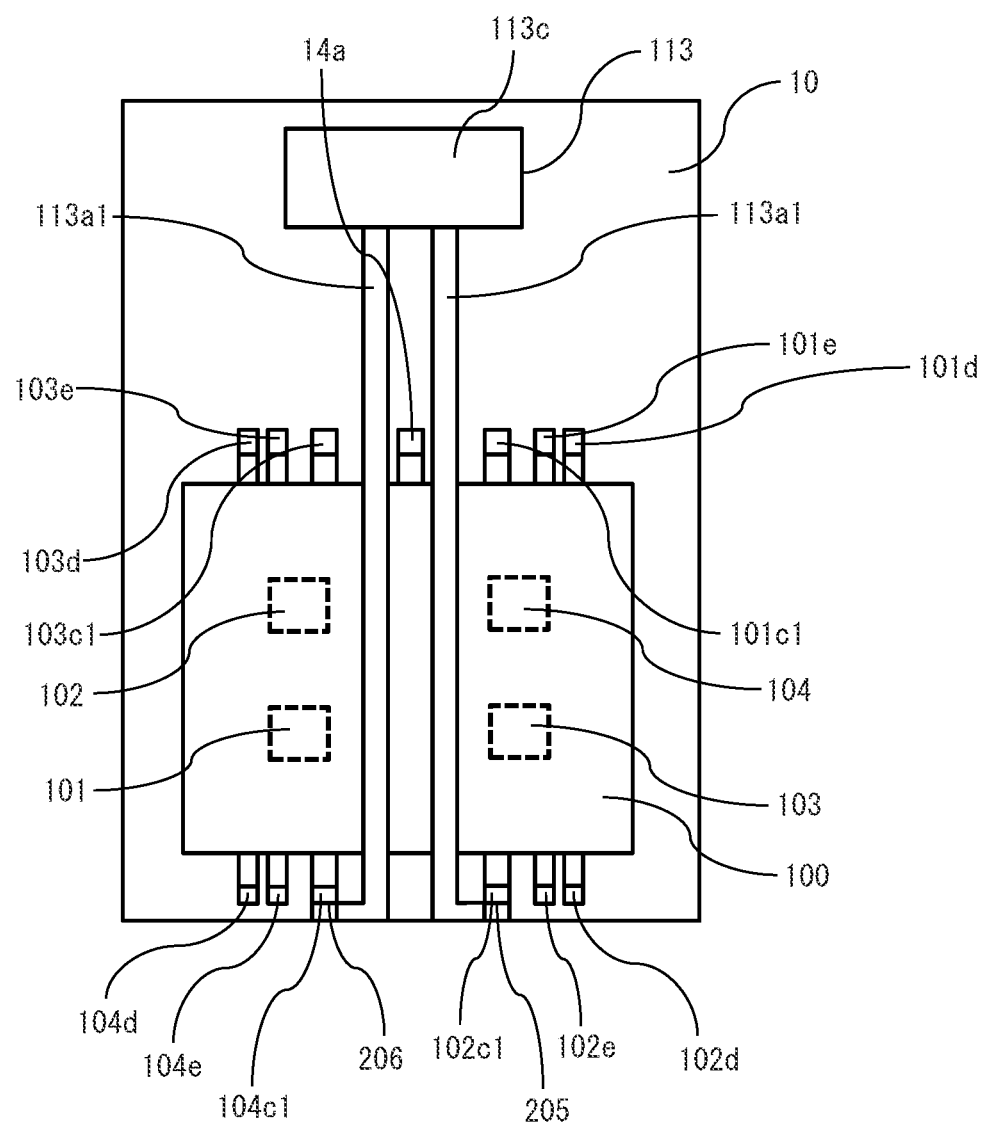
FIG. 10 is a plan view of another power converter according to the first embodiment.
Figure 11:
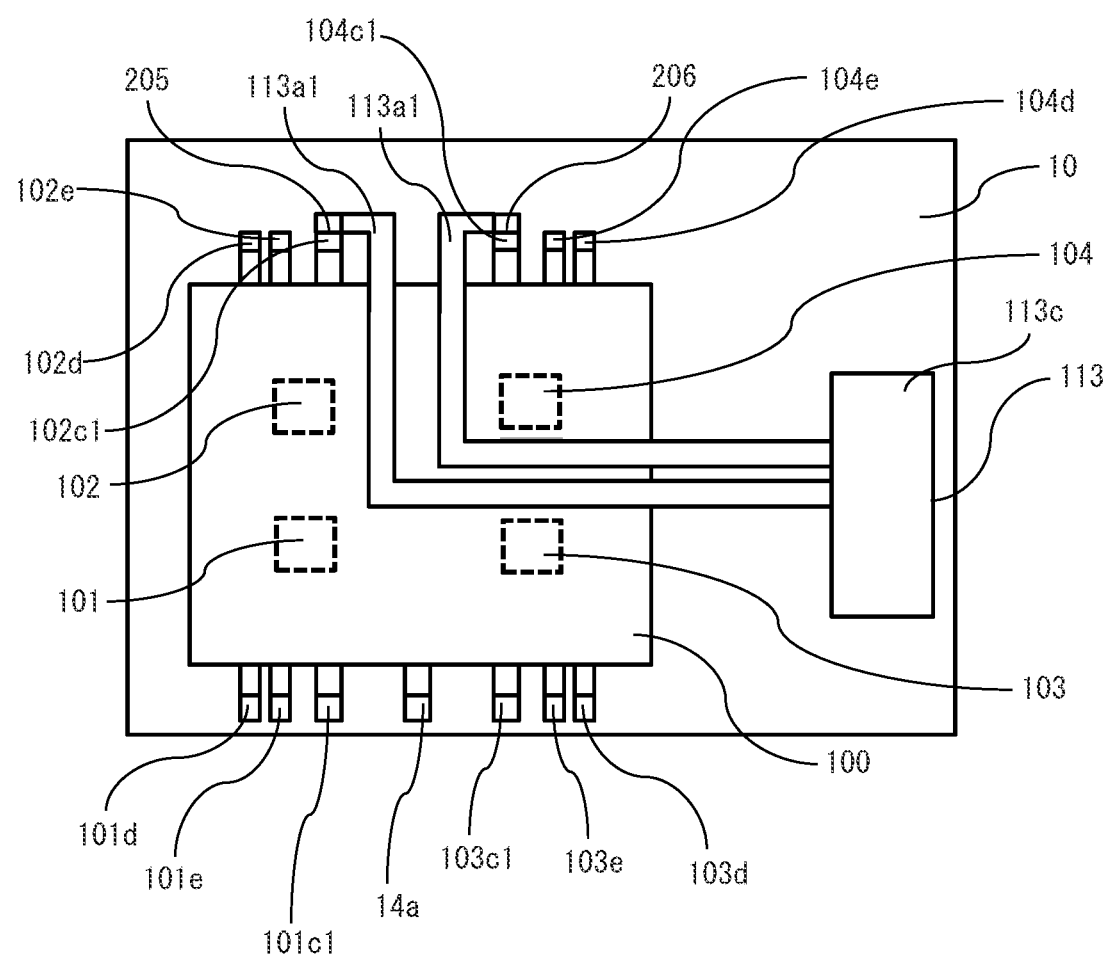
FIG. 11 is a plan view of another power converter according to the first embodiment.

A modification of the configuration of the power converter 1 will be described with reference to FIG. 10 and FIG. 11. FIG. 10 and FIG. 11 are plan views of other power converters 1 according to the first embodiment in a state in which the board 400 is removed. In FIG. 10, the transformer 113 is located on the surface side where the input terminals 101c1, 103c1, 14a are located, relative to the power module 100. In FIG. 11, the transformer 113 is located on the surface side where terminals of the power module 100 are not located, relative to the power module 100.

In the on-vehicle power converter 1 which is required to have a reduced size and an increased density, arrangement of large-sized heat generation components such as the power module 100 and the transformer 113 might be restricted depending on arrangement of a flow path of the cooler, component-fixation positions, insulation distances, height limitation, and the like. Due to such restriction, as shown in FIG. 10 and FIG. 11, the positions of the transformer 113 and the output terminals 102c1, 104c1 are more separated from each other as compared to the configuration shown in FIG. 4. In the configuration in which the transformer 113 and the output terminals 102c1, 104c1 are separated from each other, if the lead portions 113a1 and the output terminals 102c1, 104c1 are connected via the board 400 as in the comparative example shown in FIG. 8, excessively large main circuit patterns are needed.

Also in the arrangements shown in FIG. 10 and FIG. 11, the lead portions 113a1 extend toward the output terminals 102c1, 104c1, and the lead portions 113a1 and the output terminals 102c1, 104c1 are connected not via the board 400. Thus, main circuit patterns connecting the lead portions 113a1 and the output terminals 102c1, 104c1 and an area for ensuring insulation distances between the output terminals 102c1, 104c1 and the surroundings, can be removed from the board 400. In the configurations shown in FIG. 10 and FIG. 11, the lead portions 113a1 extend to the output terminals 102c1, 104c1 through a space between the power module 100 and the board 400. Since the main circuit patterns, the module connection portions 210, and the transformer connection portions 211 which are excessively large can be removed from the board 400, the size and the cost of the board 400 can be reduced. Since the size and the cost of the board 400 are reduced, the size and the cost of the power converter 1 can be reduced.

Modification 2

Another modification of the configuration of the power converter 1 will be described with reference to FIG. 12 to FIG. 14. FIG. 12 to FIG. 14 each show connection between the power module 100 and the transformer 113 of another power converter 1 according to the first embodiment, and are plan views showing connection between the power module 100 and the transformer 113 and plan views of the power module 100. In these modification examples, arrangement of the output terminals 102c1, 104c1 located at the surface of the power module 100 on the transformer 113 side is different. In addition, positions where the lead portions 113a1 extend from the body portion 113c of the transformer 113 are different from those in FIG. 4.

The output terminals 102c1, 104c1 are located at one of the third surface 100x and the fourth surface 100y opposed to each other, and the lead portions 113a1 have, at least partially, parts extending obliquely toward the third surface 100x or the fourth surface 100y at which the output terminals 102c1, 104c1 are located. In the present embodiment, the output terminals 102c1, 104c1 are located at the fourth surface 100y, and the lead portions 113a1 have, at least partially, oblique portions 17 which are the part extending obliquely toward the fourth surface 100y.

Figure 12A:
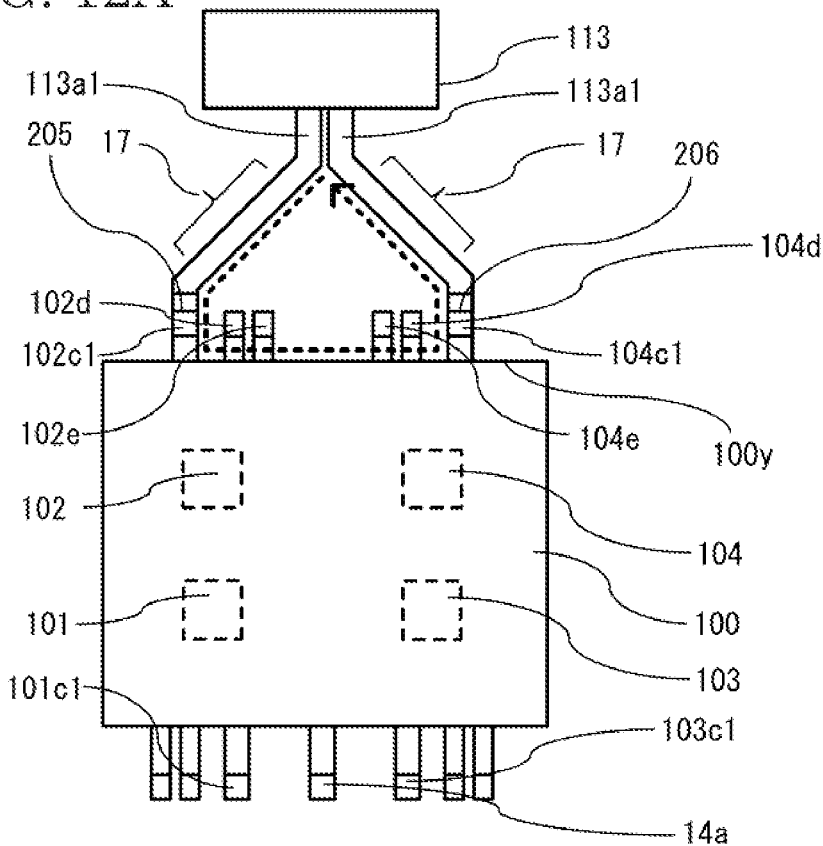
FIG. 12A shows connection between the power module and a transformer of another power converter according to the first embodiment.
Figure 12B:
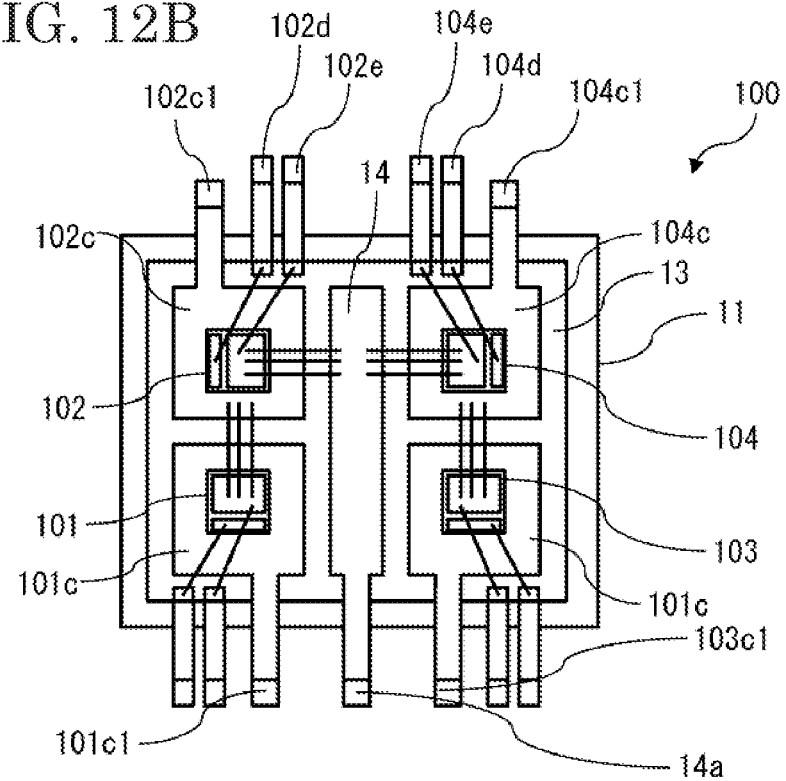
FIG. 12B is a plan view of a power module of another power converter according to the first embodiment.
Figure 13A:
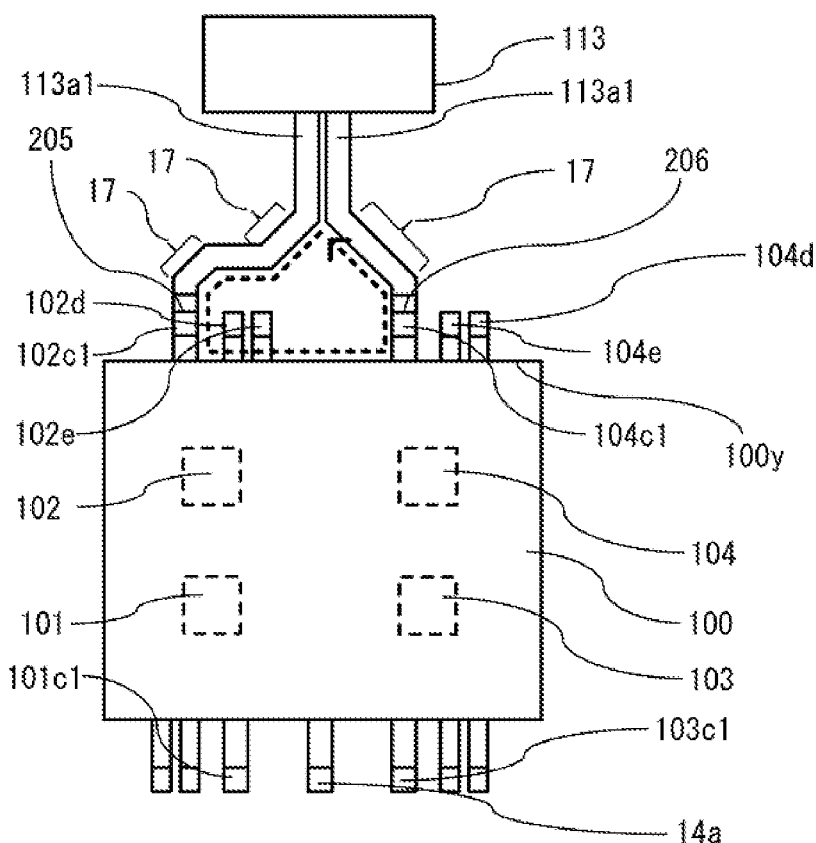
FIG. 13A shows connection between the power module and the transformer of another power converter according to the first embodiment.
Figure 13B:
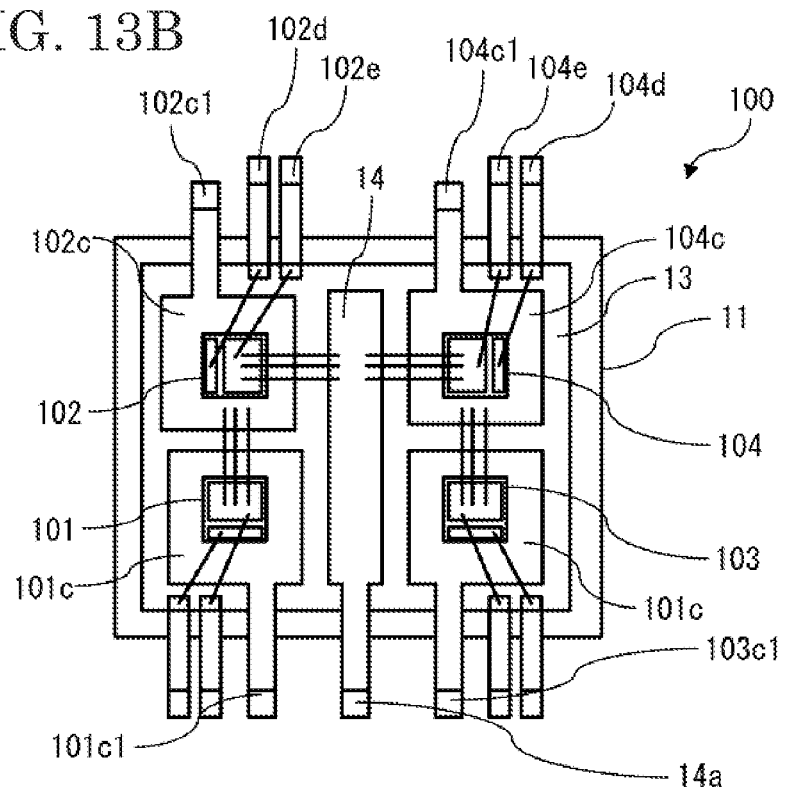
FIG. 13B is a plan view of a power module of another power converter according to the first embodiment.
Figure 14A:
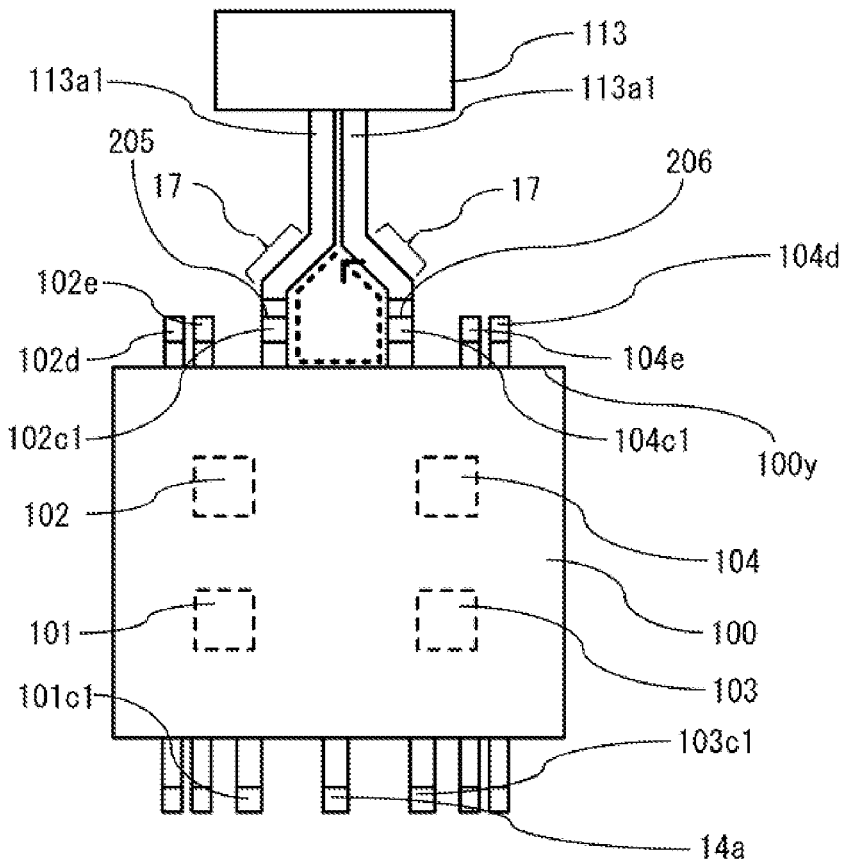
FIG. 14A shows connection between the power module and the transformer of another power converter according to the first embodiment.
Figure 14B:
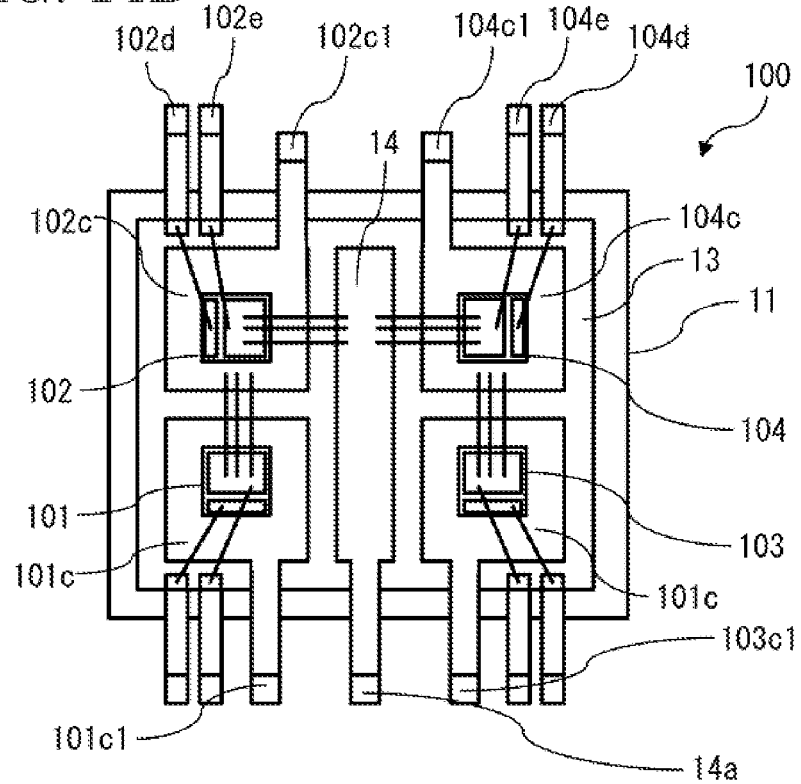
FIG. 14B is a plan view of a power module of another power converter according to the first embodiment.

In FIG. 12A, the output terminal 102c1 and the output terminal 104c1 are located on both sides of the fourth surface 100y, and the control terminals 102d, 102e, 104e, 104d are located therebetween. In FIG. 13A, the output terminal 102c1, the control terminals 102d, 102e, the output terminal 104c1, and the control terminals 104e, 104d are arranged in this order from the left. In FIG. 14A, the control terminals 102d, 102e, the output terminals 102c1, 104c1, and the control terminals 104e, 104d are arranged in this order from the left. The configurations of the power module 100 in the cases where the output terminals 102c1, 104c1 are arranged as described above are shown in FIG. 12B, FIG. 13B, and FIG. 14B. In FIG. 12B, FIG. 13B, and FIG. 14B, only major reference characters are shown.

As shown in FIG. 12A to FIG. 14A, even in a case where arrangement of the output terminals 102c1, 104c1 is changed, by providing the oblique portions 17 to the lead portions 113a1, the lead portions 113a1 and the output terminals 102c1, 104c1 can be connected through the shortest distance not via the board 400. For example, in FIG. 11, since the lead portions 113a1 do not have the oblique portions 17, the lead portions 113a1 are very long. In FIG. 12A to FIG. 14A, since the oblique portions 17 are provided, the lengths of the lead portions 113a1 are minimized. Thus, while the main circuit patterns for connecting the lead portions 113a1 and the output terminals 102c1, 104c1 are removed from the board 400 and the size and the cost of the board 400 are reduced, the cost of the primary-side winding 113a can be reduced. Since the cost of the primary-side winding 113a is reduced, the size and the cost of the power converter 1 can be reduced.

In FIG. 12A to FIG. 14A, current loops through the lead portions 113a1 and the output terminals 102c1, 104c1 are shown by broken-line arrows. As the current loop becomes smaller, the leakage inductance of the transformer 113 decreases, and as the current loop becomes larger, the leakage inductance of the transformer 113 increases. As shown in FIG. 14A, when the output terminals 102c1, 104c1 are located adjacently to each other, the leakage inductance of the transformer 113 can be reduced. Since the leakage inductance of the transformer 113 is reduced, switching loss of the switching elements 101 to 104 can be reduced and surge voltage can be reduced. Thus, the size of the power module 100 can be reduced and the X capacitor 401 can be removed, whereby the size and the cost of the power converter 1 can be further reduced.

<Connection Portions 205, 206>

Figure 15:
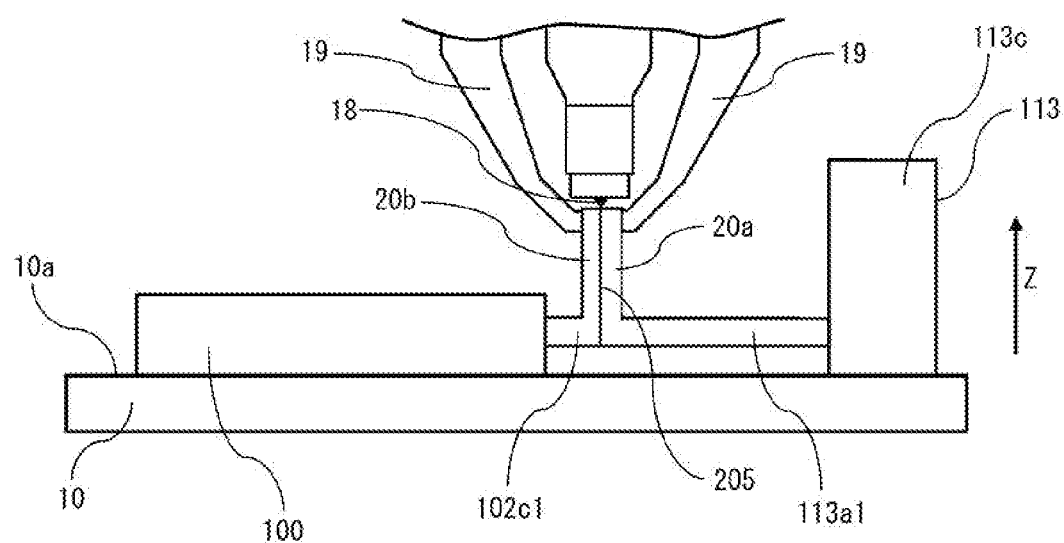
FIG. 15 shows a state at the time of connecting the power module and the transformer of the power converter according to the first embodiment.

The configurations of the connection portions 205, 206 will be described with reference to FIG. 15. FIG. 15 shows a state at the time of connecting the power module 100 and the transformer 113 of the power converter 1 according to the first embodiment, and is a sectional view of the power converter 1 taken at a position equivalent to FIG. 6. The lead portion 113a1 has at least one bending portion which is a part bent in the Z direction. In the present embodiment, the lead portion 113a1 has one bending portion 21. With this configuration, the connection portions 205, 206 with the output terminals 102c1, 104c1 can be easily ensured without providing an additional component.

Hereinafter, the output terminal 102c1 shown in FIG. 15 will be described. It is noted that the output terminal 104c1 also has the same configuration. In the present embodiment, the lead portion 113a1 has, on the output terminal 102c1 side, a bending end 20a which is a part bent in the Z direction and extending in the Z direction. The output terminal 102c1 has, on the lead portion 113a1 side, an output bending end 20b which is a part bent in the z direction and extending in the Z direction. The bending end 20a and the output bending end 20b are electrically connected so as to form the connection portion 205. With this configuration, the areas for the connection portions 205, 206 between the lead portions 113a1 and the output terminals 102c1, 104c1 can be easily ensured. Since the areas for the connection portions 205, 206 are ensured, the contact resistances between the lead portions 113a1 and the output terminals 102c1, 104c1 can be reduced. Since the contact resistances are reduced, heat generation in the connection portions 205, 206 can be suppressed.

The bending end 20a and the output bending end 20b are electrically connected by TIG welding. In FIG. 15, the bending end 20a and the output bending end 20b are connected by TIG welding. Since the connection by TIG welding is made after the power module 100 and the transformer 113 are fixed to the cooler 10, the bending end 20a and the output bending end 20b can be connected in a state in which component variations and assembly variations are absorbed. The TIG welding is an inexpensive connection method and can absorb component dimension variations and assembly variations, and therefore process management can be simplified and variation tolerance of structural components can be loosened. Since process management can be simplified and variation tolerance of structural components can be loosened, the cost of the power converter 1 can be reduced.

In the TIG welding, the bending end 20a and the output bending end 20b are fixed by a chuck portion 19, and welding is performed by an electrode portion 18. Therefore, at each connection portion 205, 206, the bending end 20a and the output bending end 20b bent in the Z direction and abutting on each other are needed. That is, the lead portion 113a1 has at least one bending portion 21 and forms the bending end 20a, whereby connection between the output terminal 102c1 and the lead portion 113a1 can be easily made by TIG welding.

The connection method for the output terminals 102c1, 104c1 and the lead portions 113a1 is not limited to TIG welding. The output terminals 102c1, 104c1 and the lead portions 113a1 may be electrically connected by screws. Although screws are needed as additional components, it is possible to easily connect the output terminals 102c1, 104c1 and the lead portions 113a1 by screws in such a case where connection portions needed for welding cannot be ensured or equipment for TIG welding cannot be prepared.

<Transformer 113>

Figure 16A:
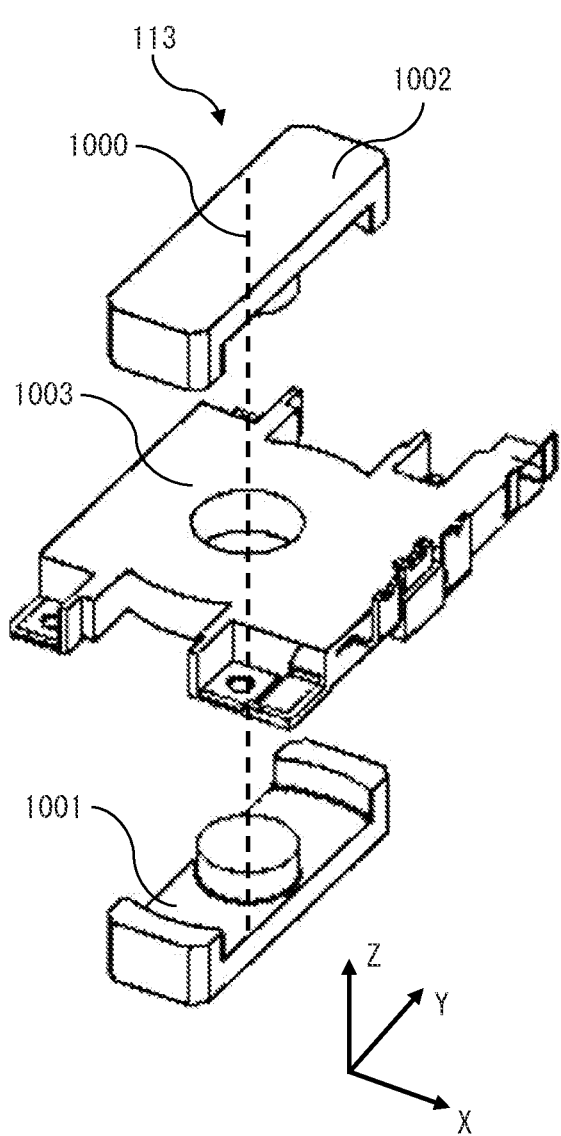
FIG. 16A is an exploded perspective view schematically showing the transformer of the power converter according to the first embodiment.
Figure 16B:
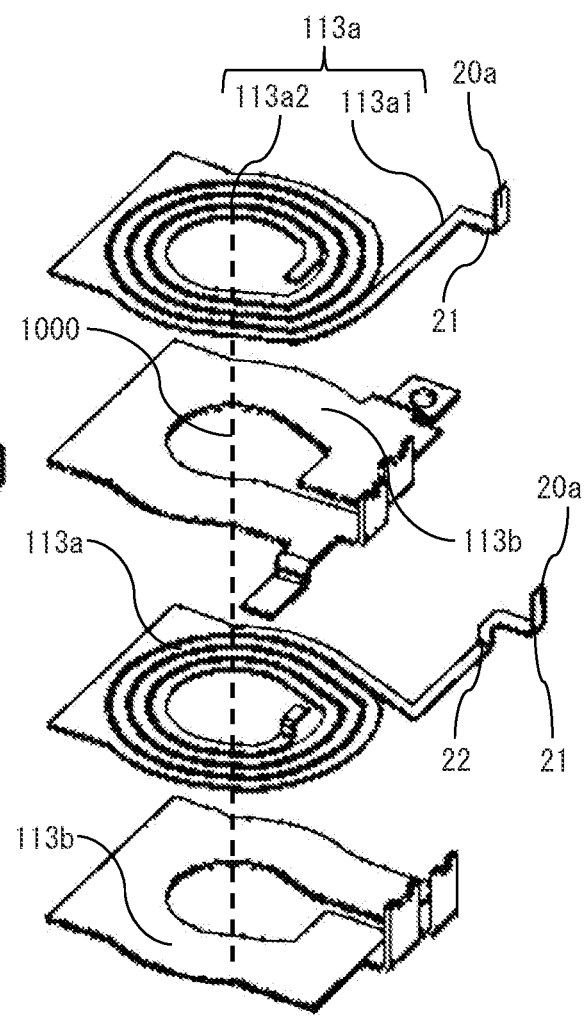
FIG. 16B is an exploded perspective view of the winding of the transformer according to the first embodiment.

A specific example of the configuration of the transformer 113 will be described with reference to FIG. 16. FIG. 16 is an exploded perspective view schematically showing the transformer 113 of the power converter 1 according to the first embodiment. FIG. 16A is an exploded perspective view of the transformer 113, and FIG. 16B is an exploded perspective view of the winding of the transformer 113. The transformer 113 has, as the winding, the primary-side winding 113a and the secondary-side winding 113b. In the present embodiment, the primary-side winding 113a and the secondary-side winding 113b are formed as flat-plate-shaped windings, and the transformer 113 is a planar-shaped transformer. As shown in FIG. 16A, the transformer 113 is formed such that a winding portion 1003 is held between a lower core 1001 and an upper core 1002. The winding portion 1003 is formed such that the primary-side windings 113a and the secondary-side windings 113b formed of sheet metal are stacked alternately. The winding portion 1003 includes a sealing resin member provided for ensuring insulation between the windings. The primary-side winding 113a and the secondary-side winding 113b are made of copper, for example. The primary-side winding 113a has the wound portion 113a2 and the lead portion 113a1 extending from the wound portion 113a2.

As compared to a winding-type transformer in which a wire is wound in the thickness direction of a core, the planar-shaped transformer is formed such that a wire is wound in an XY plane direction perpendicular to the Z direction around a winding axis 1000 parallel to the Z direction, so that the height of the transformer 113 can be lowered. It is desirable that the winding is a flat-shaped winding, e.g., a sheet metal winding, instead of a winding formed of a round wire, a litz wire, or the like used in a general transformer. When the winding is a sheet metal winding, the height of the transformer 113 can be further lowered. When the transformer 113 is the planar-shaped transformer in which the primary-side winding 113a and the secondary-side winding 113b are formed of sheet metal, the positions of the connection portions 205, 206 can be significantly lowered toward the cooling surface 10a. Since the positions of the connection portions 205, 206 are lowered, the connection portions 205, 206 can be easily placed in a space between the board 400 and the cooling surface 10a. Since the connection portions 205, 206 are placed in the space between the board 400 and the cooling surface 10a, it is not necessary to provide through holes in the board 400, so that the size of the board 400 can be reduced. Since the size of the board 400 is reduced, the size and the cost of the power converter 1 can be reduced.

When the winding is a sheet metal winding, connection between the output terminals 102c1, 104c1 and the lead portions 113a1 can be made at lower cost by TIG welding. Specifically, for example, in a case where the lead portions 113a1 are round wires, the shapes thereof are different from those of the output terminals 102c1, 104c1, and therefore, when TIG welding is performed, displacement between the terminals fixed by the chuck portion 19 and welding fault by the electrode portion 18 can occur. Accordingly, means such as terminals for changing the shapes of the round wires are needed. When the winding is a sheet metal winding, connection between the output terminals 102c1, 104c1 and the lead portions 113a1 can be made by TIG welding without additional working, whereby the power converter 1 can be provided at lower cost.

As shown in FIG. 16B, the winding of the transformer 113 is formed such that the primary-side windings 113a and the secondary-side windings 113b are stacked alternately. With this configuration, increase in the high-frequency resistance due to the proximity effect in the transformer 113 can be suppressed. Currents flowing through the primary-side winding 113a and the secondary-side winding 113b stacked adjacently to each other flow so as to concentrate at parts adjacent to each other due to the proximity effect. That is, when surfaces adjacent to each other are increased, bias of current due to the proximity effect is suppressed and the high-frequency resistance is reduced, whereby loss in the transformer 113 can be reduced. In the configuration in which the primary-side windings 113a and the secondary-side windings 113b are stacked alternately in order to reduce loss in the transformer as described above, in addition to the bending portion 21 for TIG welding, a bending portion 22 for absorbing difference between the heights of the primary-side windings 113a may be provided to the lead portion 113a1, whereby the lengths of the bending end 20a and the output bending end 20b are uniformed and thus the lengths can be minimized.

Figure 17:
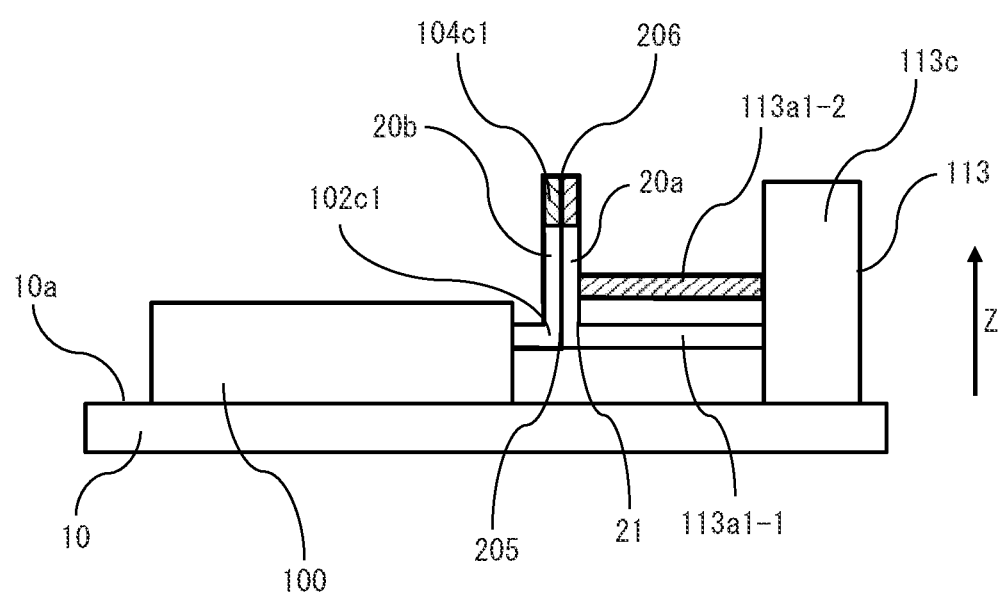
FIG. 17 is a sectional view of another power converter taken at a B-B cross-section position in FIG. 4.
Figure 18:
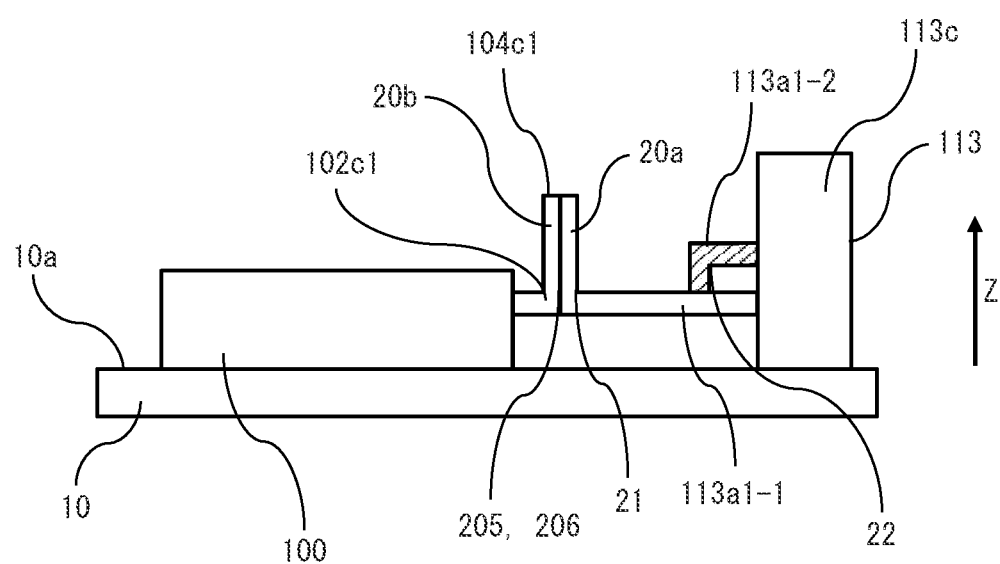
FIG. 18 is a sectional view of another power converter taken at the B-B cross-section position in FIG. 4.

Specific examples of the configuration of connection between the lead portions 113a1 and the output terminals 102c1, 104c1 will be described with reference to FIG. 17 and FIG. 18. FIG. 17 is a sectional view of another power converter 1 taken at a B-B cross-section position in FIG. 4. FIG. 18 is a sectional view of still another power converter 1 taken at the B-B cross-section position in FIG. 4. In each power converter 1 shown in FIG. 17 and FIG. 18, two lead portions 113a1 are different in their Z-direction positions at which they extend from the body portion 113c of the transformer 113 toward the output terminals 102c1, 104c1. The lead portion provided on the lower side in the Z direction is referred to as a lead portion 113a1-1, and the lead portion provided on the upper side in the Z direction is referred to as a lead portion 113a1-2. The lead portion 113a1-1 is connected to the output terminal 102c1, and the lead portion 113a1-2 is connected to the output terminal 104c1.

The lead portions 113a1-1, 113a1-2 shown in FIG. 17 each have one bending portion 21. Since the Z-direction heights of the lead portions 113a1-1, 113a1-2 are different from each other, the heights of the connection portion 205 and the connection portion 206 are different from each other and the connection portion 206 protrudes in the Z direction. In order to absorb the height difference, the Z-direction length of the output terminal 104c1 is greater than the Z-direction length of the output terminal 102c1.

The lead portion 113a1-1 shown in FIG. 18 has one bending portion 21, and the lead portion 113a1-2 has two bending portions 21, 22. The lead portion 113a1-2 protrudes from the body portion 113c of the transformer 113 and then has the bending portion 22 bent in the direction opposite to the Z direction, and the lead portion 113a1-2 extends in the direction opposite to the Z direction from the bending portion 22 and then is further bent to extend toward the connection portion 206. By the lead portion 113a1-2 having the bending portion 22, difference between the lead heights of the lead portions 113a1-1, 113a1-2 is absorbed, whereby the connection portions 205, 206 can be located at the same height. In FIG. 18, the height of the connection portion 206 can be lowered as compared to FIG. 17, and the board 400 can be located at a lower position in a case where the height of the board 400 is constrained by the connection portion 206. Since the position of the board 400 is lowered, the height of the power converter 1 can be lowered, whereby the size and the cost of the power converter 1 can be reduced.

The length of the output terminal 104*c*1 is reduced, and therefore, in a case where the size of the entire lead frame is constrained by the length of the output terminal 104*c*1, the reduction in the length of the output terminal 104*c*1 can lead to cost reduction of the power module 100. Thus, since the lead portion 113*a*1 has two bending portions in the Z direction, the Z-direction height difference between the lead portions can be absorbed, whereby the size and the cost of the power converter 1 can be reduced.

Figure 19:
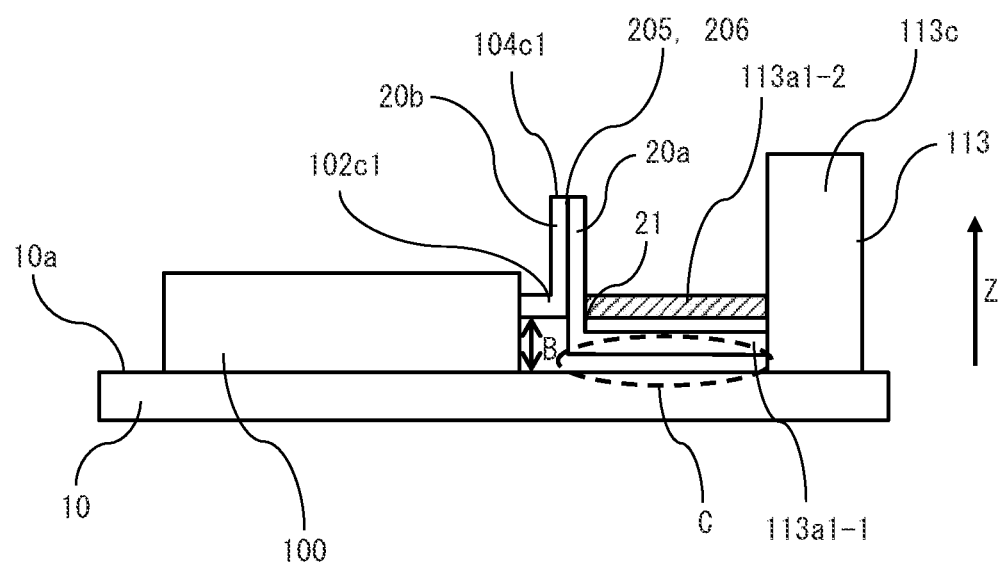
FIG. 19 is a sectional view of another power converter taken at the B-B cross-section position in FIG. 4.
Figure 20:
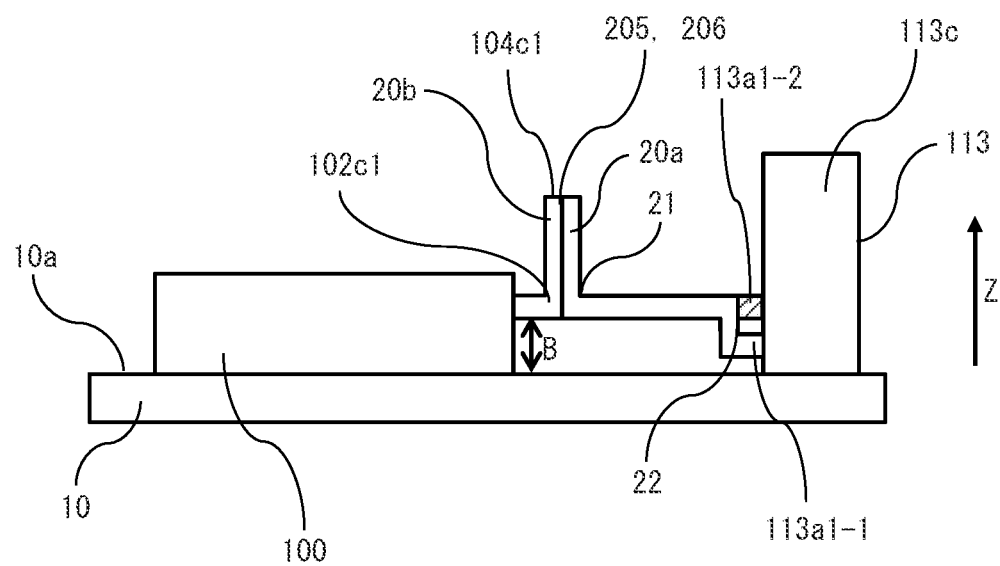
FIG. 20 is a sectional view of another power converter taken at the B-B cross-section position in FIG. 4.

Other specific examples of the configuration of connection between the lead portions 113*a*1 and the output terminals 102*c*1, 104*c*1 will be described with reference to FIG. 19 and FIG. 20. FIG. 19 is a sectional view of another power converter 1 taken at the B-B cross-section position in FIG. 4. FIG. 20 is a sectional view of still another power converter 1 taken at the B-B cross-section position in FIG. 4. In each power converter 1 shown in FIG. 19 and FIG. 20, two lead portions 113*a*1 are different in their Z-direction positions at which they extend from the body portion 113*c* of the transformer 113 toward the output terminals 102*c*1, 104*c*1. The lead portion provided on the lower side in the Z direction is referred to as a lead portion 113*a*1-1, and the lead portion provided on the upper side in the Z direction is referred to as a lead portion 113*a*1-2. The lead portion 113*a*1-1 is connected to the output terminal 102*c*1, and the lead portion 113*a*1-2 is connected to the output terminal 104*c*1. The Z-direction heights of the lead portions 113*a*1-1, 113*a*1-2 extending from the body portion 113*c* of the transformer 113 are lower than the Z-direction heights of the lead portions shown in FIG. 17.

The lead portions 113*a*1-1, 113*a*1-2 shown in FIG. 19 each have one bending portion 21. The Z-direction height at which the output terminals 102*c*1, 104*c*1 extend from the body portion of the power module 100 is defined as a height B. In the specific example shown in FIG. 19, the Z-direction height at which the lead portion 113*a*1-1 extends from the body portion 113*c* of the transformer 113 is lower than the height B. In this case, if the height B is a distance needed for insulation from the cooler 10, the insulation distance is insufficient in an area C (area enclosed by a broken line in FIG. 19) between the lead portion 113*a*1-1 and the cooler 10. Therefore, it is necessary to take measures such as cutting a part of the cooling surface 10*a* of the cooler 10 to ensure the insulation distance or providing an insulation member in the area C. In the former case, the cost and the size of the cooler 10 are increased, and in the latter case, the cost increases due to addition of the insulation member. The influence of such increase becomes greater as the area C becomes larger.

The lead portion 113*a*1-1 shown in FIG. 20 has two bending portions 21, 22, and the lead portion 113*a*1-2 has one bending portion 21. The lead portion 113*a*1-1 protrudes from the body portion 113*c* of the transformer 113 and then has the bending portion 22 bent in the Z direction, and the lead portion 113*a*1-1 extends in the Z direction from the bending portion 22 and then is further bent to extend toward the connection portion 205. By the lead portion 113*a*1-1 having the bending portion 22, a part where additional insulation measures are needed in the area C can be significantly reduced. As shown in FIG. 16A, the winding portion 1003 is provided with the sealing resin member for ensuring insulation between the windings. Therefore, when the area C is significantly reduced, it is possible to ensure insulation from the cooler 10 in the area C using the sealing resin member of the winding portion 1003 by slightly extending the sealing resin member. Thus, by the lead portion 113*a*1-1 having two bending portions 21, 22, insulation measures due to the Z-direction height difference between the lead portions 113*a*1-1, 113*a*1-2 can be performed with almost no increase in cost.

In the planar-shaped transformer 113 in which the primary-side windings 113*a* and the secondary-side windings 113*b* formed of sheet metal are stacked, even if the Z-direction heights of the lead portions 113*a*1-1, 113*a*1-2 are different from each other, it is possible to absorb the Z-direction height difference between the lead portions 113*a*1-1, 113*a*1-2 when one of the lead portions 113*a*1-1, 113*a*1-2 has two bending portions 21, 22. Since the Z-direction height difference between the lead portions 113*a*1-1, 113*a*1-2 is absorbed, the lead portions 113*a*1-1, 113*a*1-2 and the output terminals 102*c*1, 104*c*1 can be connected in a space on the power module 100 side of the board 400. Since the lead portions 113*a*1-1, 113*a*1-2 and the output terminals 102*c*1, 104*c*1 are connected in the space on the power module 100 side of the board 400, the main circuit patterns can be removed from the board 400, whereby the size and the cost of the board 400 can be reduced. Since the size and the cost of the board 400 are reduced, the size and the cost of the power converter 1 can be reduced.

Figure 21:
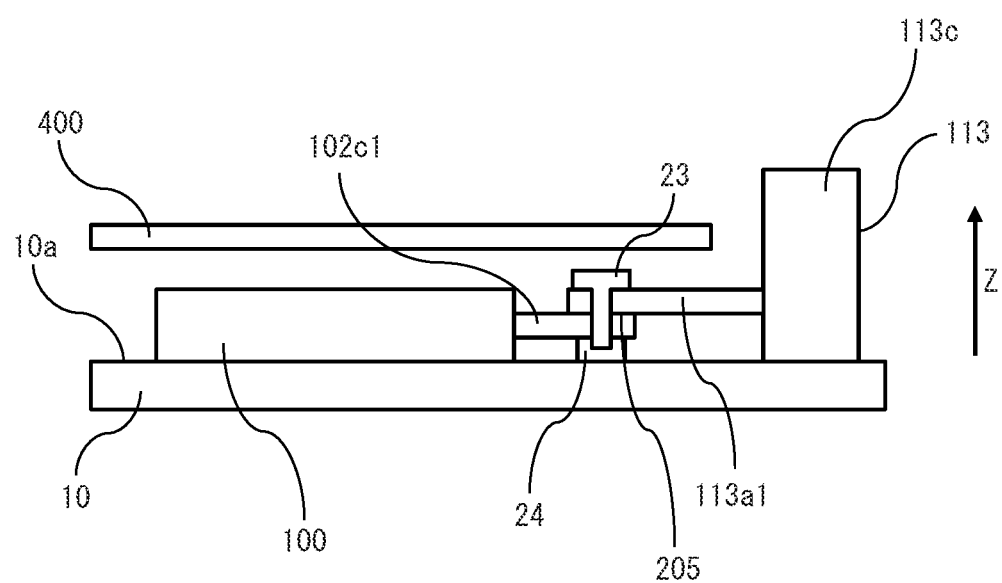
FIG. 21 is a sectional view of the power module of another power converter according to the first embodiment.

A specific configuration example in which the output terminals 102*c*1, 104*c*1 and the lead portions 113*a*1 are electrically connected by screws will be described with reference to FIG. 21. FIG. 21 is a sectional view of another power converter 1 according to the first embodiment taken at the position of the connection portion 205. Hereinafter, the connection portion 205 will be described. It is noted that the connection portion 206 has the same configuration. The output terminal 102*c*1 extends from the body portion of the power module 100 toward the body portion 113*c* of the transformer 113, and the lead portion 113*a*1 extends from the body portion 113*c* of the transformer 113 toward the body portion of the power module 100. The connection portion 205 is formed at a part where an end of the output terminal 102*c*1 and an end of the lead portion 113*a*1 are overlaid on each other, and the output terminal 102*c*1 and the lead portion 113*a*1 are fastened by a screw 23 at the connection portion 205.

In connection by screwing, the output terminal 102*c*1 and the lead portion 113*a*1 are connected by the screw 23 and a screw reception portion 24 for receiving the screw, such as an insert nut, for example. In this configuration, since the screw 23 and the screw reception portion 24 are needed as additional members, the cost slightly increases as compared to the configuration in which connection is made by TIG welding. However, the cost can be significantly reduced as compared to the conventional configuration in which connection is made by adding a busbar which is a wiring member. In addition, as compared to the configuration in FIG. 15 in which connection is made by TIG welding, the Z-direction position of the connection portion 205 at which the output terminal 102*c*1 and the lead portion 113*a*1 are connected can be lowered. Since the Z-direction position of the connection portion 205 is lowered, the Z-direction height of the board 400 can be lowered. In a case where the Z-direction height of the board 400 is constrained by the height of the connection portion 205, the board 400 can be located at a lower position by adopting the above configuration. Since the position of the board 400 is lowered, the height of the power converter 1 can be lowered, whereby the size and the cost of the power converter 1 can be reduced.

In the present embodiment, the number of turns of the primary-side winding 113*a* is larger than the number of turns of the secondary-side winding 113*b*, and the output terminals 102*c*1, 104*c*1 are connected to the primary-side winding 113a. Thus, regarding the turns ratio between the primary-side winding 113a and the secondary-side winding 113b of the transformer 113, it is desirable that the number of turns of the primary-side winding 113a is larger, as shown in FIG. 16B.

In the present embodiment, the lead portions 113a1 are provided to the primary-side winding 113a and are connected to the output terminals 102c1, 104c1 of the power module 100. Therefore, each lead portion 113a1 has one or a plurality of bending portions 21, 22 so as to match the height with the output terminal 102c1, 104c1. Since the number of turns of the primary-side winding 113a is larger than the number of turns of the secondary-side winding 113b, current flowing through the primary-side winding 113a is smaller than current flowing through the secondary-side winding 113b. Since current flowing through the primary-side winding 113a is smaller than current flowing through the secondary-side winding 113b, the sectional area of the primary-side winding 113a can be made smaller than the sectional area of the secondary-side winding 113b, whereby bending work for the bending portion can be easily performed. Since bending work for the bending portion can be easily performed, productivity of the power converter 1 can be improved. In addition, the cost of the power converter 1 can be reduced.

The input terminals 101c1, 103c1, 14a of the power module 100 are connected to the board 400, and their connection with the DC power supply 200 is made via the power supply terminal portions 201, 202 provided to the board 400. Therefore, as current flowing on the primary side becomes smaller, the power supply terminal portions 201, 202 shown in FIG. 5 can be made smaller. Since the power supply terminal portions 201, 202 are made smaller, the size of the board 400 can be further reduced.

<Buck Converter>

In the present embodiment, the power converter 1 is a buck converter, for example. The power converter 1 includes the rectification circuit 114 which rectifies voltage outputted from the secondary-side winding 113b, and a smoothing circuit which smooths the voltage outputted from the secondary-side winding 113b. The rectification circuit 114 is composed of a plurality of semiconductor elements. The semiconductor elements are diodes 115, 116. The smoothing circuit is composed of a reactor and a capacitor. As shown in FIG. 1, the reactor is the smoothing reactor 108, and the capacitor is the output capacitor 109.

The power converter 1 in which primary-side current is small and secondary-side current is great is preferably an isolation buck converter which converts DC power of a high-voltage battery of an electrified vehicle to low-voltage DC power and supplies the power to an auxiliary device of a 12 V system in the vehicle, for example. In such a buck converter, the primary-side current is several Arms to ten and several Arms, whereas the secondary-side current is several tens of Arms to several hundreds of Arms and thus the secondary-side current is extremely greater than the primary-side current. The circuit diagram is as shown in FIG. 1, for example.

As shown in FIG. 1, on the primary side of the buck converter, there are many components mounted to the board 400, such as the fuse 404, the capacitors, and the current sensor 405. Therefore, connection from the DC power supply 200 to the input terminals 101c1, 103c1, 14a of the power module 100 is preferably made at the power supply terminal portions 201, 202 on the board 400 via the board 400. Since the primary-side current is as small as several Arms to ten and several Arms, it is possible to make connection by main circuit patterns including the power supply terminal portions 201, 202 on the board 400. On the other hand, the secondary-side current is several tens of Arms to several hundreds of Arms, wiring for connecting the secondary-side winding 113b, the smoothing reactor 108, and terminals of the rectification circuit 114 is often formed using sheet metal or a busbar, and connection between these parts is often made by TIG welding not via the board 400. Therefore, in the case where the power converter 1 is a buck converter, it is possible to provide the power converter 1 at lower cost without an additional process and additional equipment cost of a welding machine or the like at the time of performing TIG welding for connection between the output terminals 102c1, 104c1 of the power module 100 and the primary-side winding 113a.

As described above, in the power converter 1 according to the first embodiment, the power module 100 has the input terminals 101c1, 103c1, 14a electrically connected to the power supply terminal portions 201, 202, the output terminals 102c1, 104c1 electrically connected to the winding, and the control terminals 101d to 104d, 101e to 104e electrically connected to the control circuit 406, the power supply terminal portions 201, 202 and the input terminals 101c1, 103c1, 14a are connected via the board 400, the control circuit 406 and the control terminals 101d to 104d, 101e to 104e are connected via the board 400, and the winding and the output terminals 102c1, 104c1 are connected not via the board 400, the winding has the wound portion, and the lead portion 113a1 extending from the wound portion toward each corresponding output terminal 102c1, 104c1 and connected to the output terminal 102c1, 104c1, and the length in the lead portion 113a1 from the body portion of the transformer 113 in which the wound portion is stored to the connection portion between the output terminal 102c1, 104c1 and the lead portion 113a1 is greater than the length in the output terminal 102c1, 104c1 from the body portion of the power module 100 to the connection portion. Thus, main circuit patterns connecting the lead portions 113a1 and the output terminals 102c1, 104c1 and an area for ensuring insulation distances between the output terminals 102c1, 104c1 and the surroundings, can be removed from the board 400, whereby the size and the cost of the board 400 can be reduced. Since the size and the cost of the board 400 are reduced, the size and the cost of the power converter 1 can be reduced.

Since an additional component is not needed for connection between the lead portions 113a1 and the output terminals 102c1, 104c1, cost increase due to an additional component can be suppressed. Since the lead portions 113a1 extend toward the output terminals 102c1, 104c1, there is no additional component, cost increase is suppressed, and the size and the cost of the board 400 can be significantly reduced, whereby size reduction and cost reduction of the power converter 1 can be achieved.

The plurality of switching elements may include a first switching element and a second switching element, the first switching element and the second switching element may be connected in series to each other, and a first connection portion at which the first switching element and the second switching element are connected may be electrically connected to a first output terminal which is the output terminal. Thus, when the output terminal 102c1 is a connection point between the switching elements 101, 102, the effect by removing the main circuit patterns from the board 400 can be increased. When the connection portions 212 are removed from the board 400, the area that can be removed is larger than when the power supply terminal portions 201, 202 are removed from the board 400. Thus, removing the connection portions 212 from the board 400 can more reduce the size of the board 400.

The plurality of switching elements may include a third switching element and a fourth switching element, the third switching element and the fourth switching element may be connected in series to each other, a second connection portion at which the third switching element and the fourth switching element are connected may be electrically connected to a second output terminal which is the output terminal, and the first output terminal and the second output terminal may be located adjacently to each other. Thus, the leakage inductance of the transformer 113 can be reduced. Since the leakage inductance of the transformer 113 is reduced, switching loss of the switching elements 101 to 104 can be reduced and surge voltage can be reduced. Thus, the size of the power module 100 can be reduced and the X capacitor 401 can be removed, whereby the size and the cost of the power converter 1 can be further reduced.

The input terminals 101$c$1, 103$c$1, 14$a$ may extend in the Z direction and be connected to the board 400. Thus, the lengths of the input terminals 101$c$1, 103$c$1, 14$a$ can be reduced. Since the lengths of the input terminals 101$c$1, 103$c$1, 14$a$ are reduced, the resistances of the input terminals 101$c$1, 103$c$1, 14$a$ are reduced, so that heat generation in the input terminals 101$c$1, 103$c$1, 14$a$ can be suppressed. In addition, since the lengths of the input terminals 101$c$1, 103$c$1, 14$a$ are reduced, the cost of the input terminals 101$c$1, 103$c$1, 14$a$ can be reduced.

The lead portion 113$a$1 may have at least one bending portion which is a part bent in the Z direction. Thus, the connection portions 205, 206 with the output terminals 102$c$1, 104$c$1 can be easily ensured without providing an additional component. In addition, the connection portions 205, 206 can be located at the same height, and therefore the board 400 can be located at a lower position.

The lead portion 113$a$1 may have, on the output terminal 102$c$1 side, the bending end 20$a$ which is a part bent in the Z direction and extending in the Z direction, the output terminal 102$c$1 may have, on the lead portion 113$a$1 side, the output bending end 20$b$ which is a part bent in the Z direction and extending in the Z direction, and the bending end 20$a$ and the output bending end 20$b$ may be electrically connected so as to form the connection portion 205. Thus, the areas for the connection portions 205, 206 between the lead portions 113$a$1 and the output terminals 102$c$1, 104$c$1 can be easily ensured. Since the areas for the connection portions 205, 206 are ensured, the contact resistances between the lead portions 113$a$1 and the output terminals 102$c$1, 104$c$1 can be reduced. Since the contact resistances are reduced, heat generation in the connection portions 205, 206 can be suppressed.

The lead portion 113$a$1-2 may protrude from the body portion 113$c$ of the transformer 113 and then have the bending portion 22 bent in the direction opposite to the Z direction, and the lead portion 113$a$1-2 may extend in the direction opposite to the Z direction from the bending portion 22 and then be further bent to extend toward the connection portion 206. Thus, by the lead portion 113$a$1-2 having the bending portion 22, difference between the lead heights of the lead portions 113$a$1-1, 113$a$1-2 is absorbed, whereby the connection portions 205, 206 can be located at the same height. Since the connection portions 205, 206 can be located at the same height, the board 400 can be located at a lower position. Since the position of the board 400 is lowered, the height of the power converter 1 can be lowered, whereby the size and the cost of the power converter 1 can be reduced.

The output terminals 102$c$1, 104$c$1 may be located at one of the third surface 100$x$ and the fourth surface 100$y$ opposed to each other, and the lead portions 113$a$1 may have, at least partially, parts extending obliquely toward the third surface 100$x$ or the fourth surface 100$y$ at which the output terminals 102$c$1, 104$c$1 are located. Thus, even in a case where arrangement of the output terminals 102$c$1, 104$c$1 is changed, by providing the oblique portions 17 to the lead portions 113$a$1, the lead portions 113$a$1 and the output terminals 102$c$1, 104$c$1 can be connected through the shortest distance not via the board 400. While the main circuit patterns for connecting the lead portions 113$a$1 and the output terminals 102$c$1, 104$c$1 are removed from the board 400 and the size and the cost of the board 400 are reduced, the cost of the primary-side winding 113$a$ can be reduced. Since the cost of the primary-side winding 113$a$ is reduced, the size and the cost of the power converter 1 can be reduced.

The input terminals 101$c$1, 103$c$1, 14$a$ may be located at one of the third surface 100$x$ and the fourth surface 100$y$ opposed to each other, the output terminals 102$c$1, 104$c$1 may be located at the other of the third surface 100$x$ and the fourth surface 100$y$ opposed to each other, and the transformer 113 may be located on the surface side where the output terminals 102$c$1, 104$c$1 are located. Thus, the lengths 15$a$, 15$b$ in the lead portions 113$a$1 can be reduced. Since the lengths 15$a$, 15$b$ in the lead portions 113$a$1 are reduced, the cost of the primary-side winding 113$a$ can be reduced. In addition, the leakage inductance of the transformer 113 can be reduced. Since the leakage inductance of the transformer 113 is reduced, switching loss of the switching elements 101 to 104 can be reduced and surge voltage can be reduced. Thus, the size of the power module 100 can be reduced and the X capacitor 401 can be removed, whereby the size and the cost of the power converter 1 can be further reduced.

The board surface of the board 400 may be located, with a gap provided from the power module 100, on the side opposite to the cooler 10 side of the power module 100, and the connection portions 205, 206 may be located in an area between the board 400 and the cooler 10. Thus, the connection portions 205, 206 and the board 400 do not interfere with each other and through holes need not be provided in the board 400, so that the size of the board 400 can be further reduced.

As seen in the Z direction, the output terminals 102$c$1, 104$c$1 and at least parts of the lead portions 113$a$1 may be located so as to overlap the board 400, and the lengths of the parts where the lead portions 113$a$1 overlap the board 400 may be greater than the lengths of the parts where the output terminals 102$c$1, 104$c$1 overlap the board 400. Thus, it is possible to ensure a larger area where the control circuit 406 is arranged around the control-side connection portions 207. Therefore, the degree of freedom in layout of the control circuit 406 is improved, so that it becomes possible to arrange the control circuit 406 with high efficiency without waste. In addition to size reduction of the board 400 by an amount corresponding to the area of the main circuit patterns that would be originally present, owing to arrangement of the control circuit 406 with high efficiency without waste, the size and the cost of the board 400 can be further reduced.

The bending end 20$a$ and the output bending end 20$b$ may be electrically connected by TIG welding. Thus, since the connection by TIG welding is made after the power module 100 and the transformer 113 are fixed to the cooler 10, the bending end 20a and the output bending end 20b can be connected in a state in which component variations and assembly variations are absorbed. The TIG welding is an inexpensive connection method and can absorb component dimension variations and assembly variations, and therefore process management can be simplified and variation tolerance of structural components can be loosened. Since process management can be simplified and variation tolerance of structural components can be loosened, the cost of the power converter 1 can be reduced.

The output terminals 102c1, 104c1 and the lead portions 113a1 may be electrically connected by screws. Thus, although screws are needed as additional components, it is possible to easily connect the output terminals 102c1, 104c1 and the lead portions 113a1 by screws in such a case where connection portions needed for welding cannot be ensured or equipment for TIG welding cannot be prepared.

The output terminal 102c1 may extend from the body portion of the power module 100 toward the body portion 113c of the transformer 113, the lead portion 113a1 may extend from the body portion 113c of the transformer 113 toward the body portion of the power module 100, the connection portion 205 may be formed at a part where an end of the output terminal 102c1 and an end of the lead portion 113a1 are overlaid on each other, and the output terminal 102c1 and the lead portion 113a1 may be fastened by the screw 23 at the connection portion 205. Thus, the cost can be reduced as compared to the conventional configuration in which connection is made by adding a busbar which is a wiring member. In addition, as compared to the configuration in which connection is made by TIG welding, the Z-direction position of the connection portion 205 at which the output terminal 102c1 and the lead portion 113a1 are connected can be lowered. Since the Z-direction position of the connection portion 205 is lowered, the Z-direction height of the board 400 can be reduced. Since the Z-direction position of the board 400 is lowered, the height of the power converter 1 can be lowered, whereby the size and the cost of the power converter 1 can be reduced.

The number of turns of the primary-side winding 113a may be larger than the number of turns of the secondary-side winding 113b, and the output terminals 102c1, 104c1 may be connected to the primary-side winding 113a. Thus, since current flowing through the primary-side winding 113a is smaller than current flowing through the secondary-side winding 113b, the sectional area of the primary-side winding 113a can be made smaller than the sectional area of the secondary-side winding 113b, whereby bending work for the bending portion can be easily performed. Since bending work for the bending portion can be easily performed, productivity of the power converter 1 can be improved. In addition, the cost of the power converter 1 can be reduced.

The power converter 1 may be a buck converter and include the rectification circuit 114 which rectifies voltage outputted from the secondary-side winding 113b, and the smoothing circuit which smooths the voltage outputted from the secondary-side winding 113b, the rectification circuit 114 may be composed of a plurality of semiconductor elements, and the smoothing circuit may be composed of a reactor and a capacitor. Thus, since the primary-side current is as small as several Arms to ten and several Arms, it is possible to make connection by main circuit patterns including the power supply terminal portions 201, 202 on the board 400. On the other hand, the secondary-side current is several tens of Arms to several hundreds of Arms, and in the case where the power converter 1 is a buck converter, it is possible to provide the power converter 1 at lower cost without an additional process and additional equipment cost of a welding machine or the like at the time of performing TIG welding for connection between the output terminals 102c1, 104c1 of the power module 100 and the primary-side winding 113a.

The transformer 113 may have, as the winding, the primary-side winding 113a and the secondary-side winding 113b, the primary-side winding 113a and the secondary-side winding 113b may be formed as a flat-plate-shaped winding, and the transformer 113 may be a planar-shaped transformer. Thus, as compared to a winding-type transformer in which a wire is wound in the thickness direction of a core, the planar-shaped transformer is formed such that a wire is wound in the XY plane direction perpendicular to the Z direction around the winding axis 1000 parallel to the Z direction, so that the height of the transformer 113 can be lowered. In addition, the positions of the connection portions 205, 206 can be significantly lowered toward the cooling surface 10a. Since the positions of the connection portions 205, 206 are lowered, the connection portions 205, 206 can be easily placed in a space between the board 400 and the cooling surface 10a. Since the connection portions 205, 206 are placed in the space between the board 400 and the cooling surface 10a, the size of the board 400 can be reduced without providing through holes in the board 400. Since the size of the board 400 is reduced, the size and the cost of the power converter 1 can be reduced.

Second Embodiment

Figure 22:
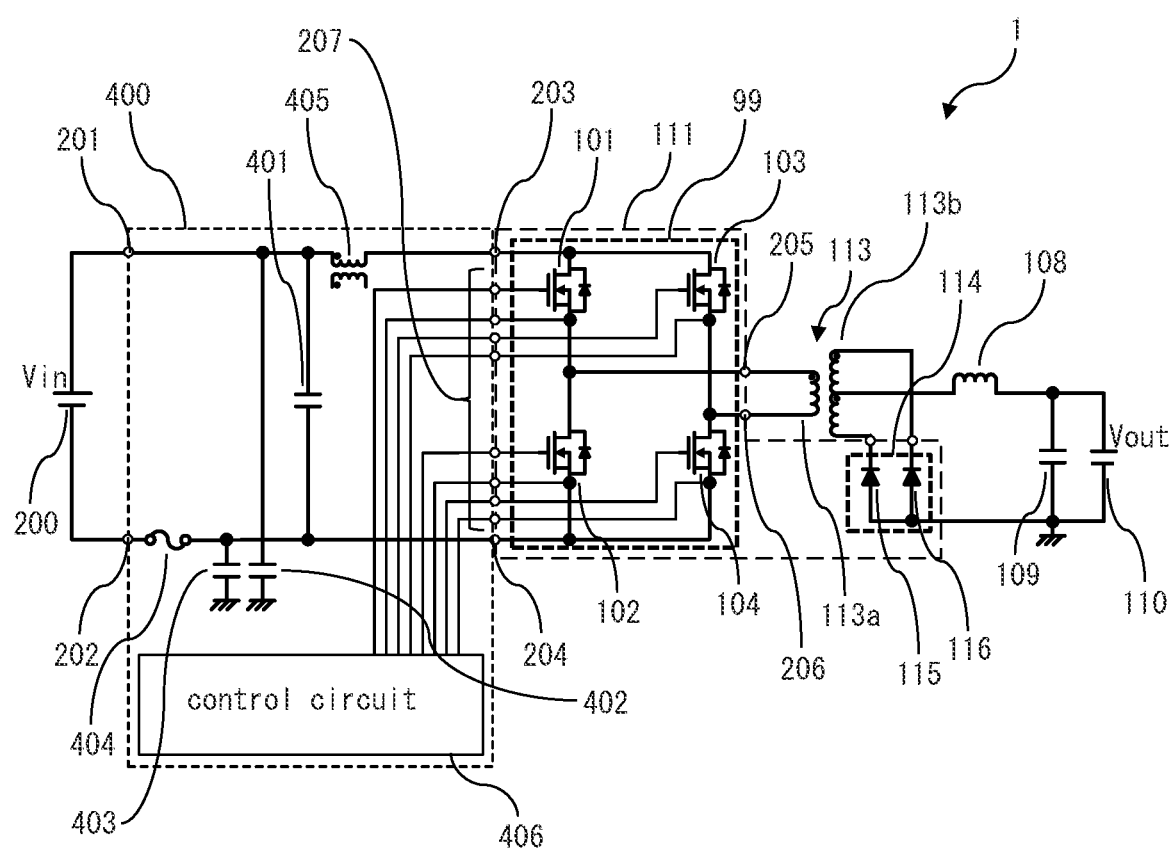
FIG. 22 shows a circuit configuration of a power converter according to the second embodiment of the present disclosure.
Figure 23:
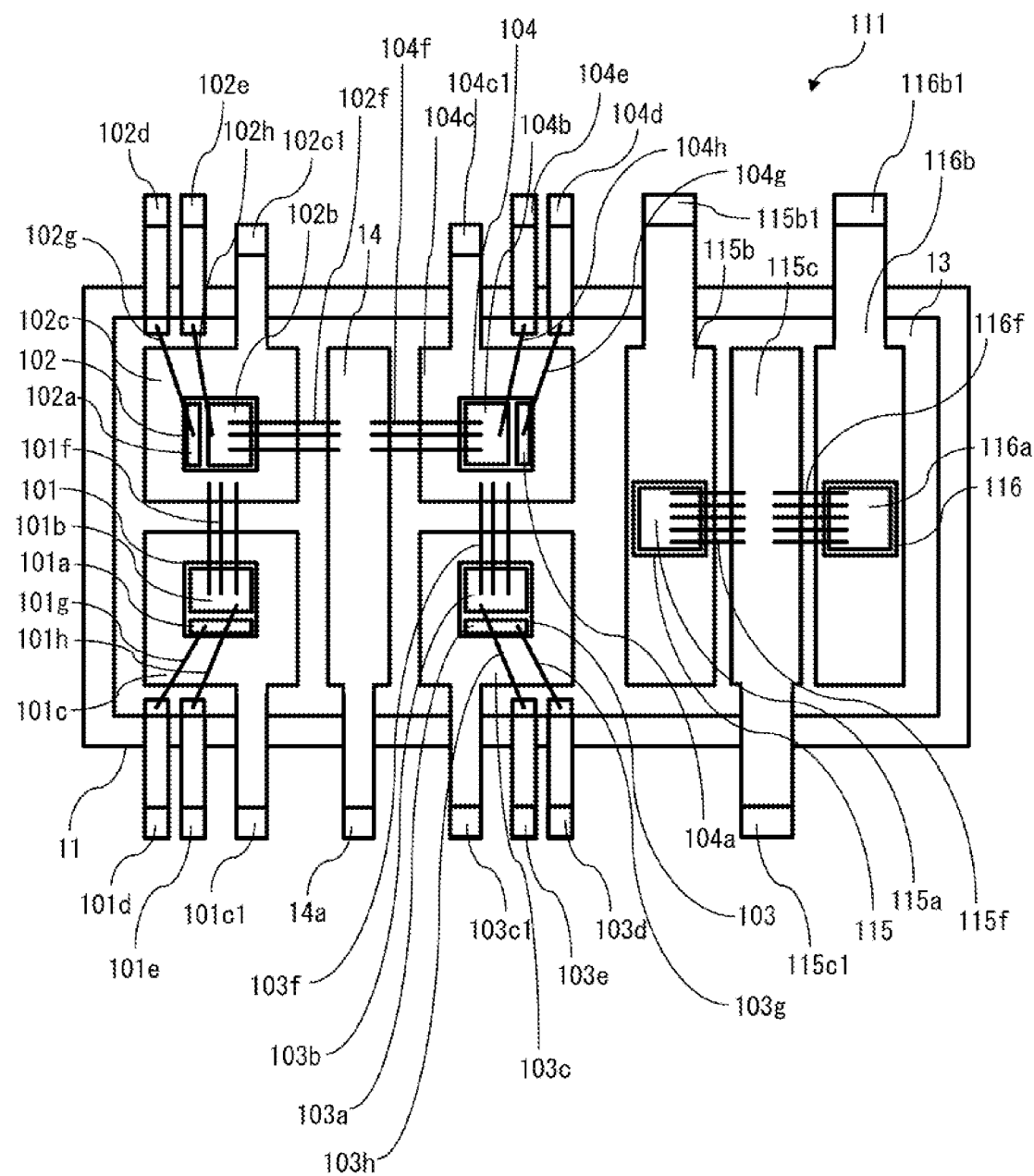
FIG. 23 is a plan view of the power module of the power converter according to the second embodiment.
Figure 24:
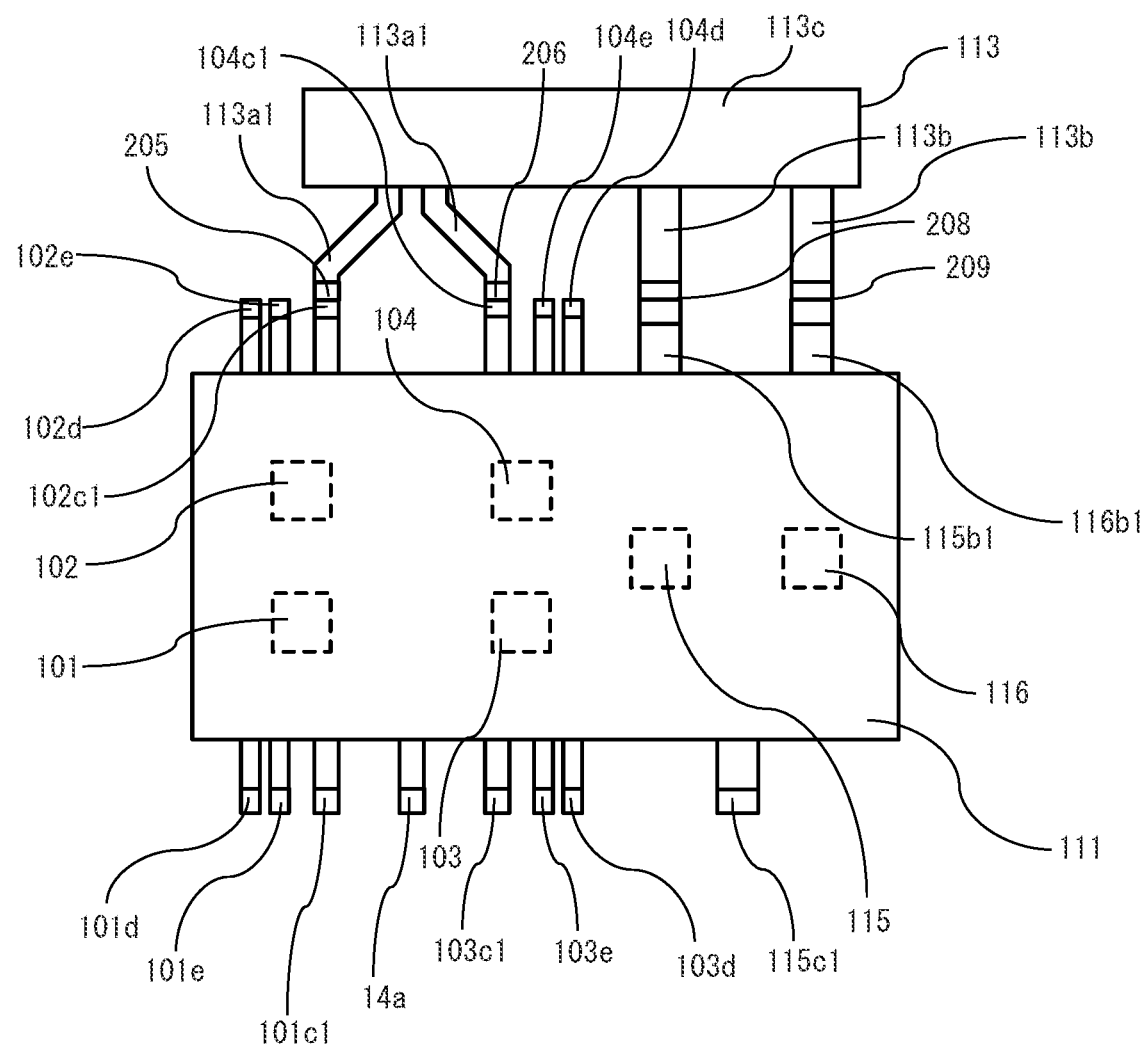
FIG. 24 shows connection between the power module and a transformer of the power converter according to the second embodiment.

A power converter 1 according to the second embodiment of the present disclosure will be described. FIG. 22 shows a circuit configuration of the power converter 1 according to the second embodiment. FIG. 23 is a plan view of a power module 111 of the power converter 1 in a state in which the resin 11 is removed and for the resin 11, only an outer shape is shown. FIG. 24 shows connection between the power module 111 and the transformer 113 of the power converter 1. In the power converter 1 according to the second embodiment, the power module 111 is configured as a module including an additional component.

The power module 111 is a module in which the plurality of switching elements 101 to 104 connected to the primary-side winding 113a of the transformer 113, and the diodes 115, 116 which are a plurality of semiconductor elements, are integrated. The diodes 115, 116 are rectification elements composing the rectification circuit 114. In the present embodiment, the power module 111 is configured as a module including the rectification circuit 114, as shown in FIG. 22. At connection portions 208, 209 between the secondary-side winding 113b and the cathode sides of the diodes 115, 116, connection is made directly not via the board 400. The other components are the same as those in FIG. 1 in the first embodiment. Therefore, they are denoted by the same reference characters and the description thereof is omitted.

An example of a mounting configuration of the power module 111 will be described with reference to FIG. 23. The power module 111 further has three lead frames 115b, 115c, 116b in addition to the five lead frames 101c to 104c, 14. The added lead frames are also copper plates, for example. The diode 115 is a semiconductor chip having a cathode pad on the bottom surface and an anode pad 115a on the top surface, for example. The diode 116 is also a semiconductor chip having a cathode pad on the bottom surface and an anode pad 116a on the top surface, for example. The diodes 115, 116 are respectively mounted to the lead frames 115b, 116b.

The anode pad 115a of the diode 115 is connected to the lead frame 115c via a bonding wire 115f, and the anode pad 116a of the diode 116 is connected to the lead frame 115c via a bonding wire 116f. The lead frame 115c has a cathode terminal 115c1. The cathode terminal 115c1 is connected to GND of a housing (not shown) in which the power converter 1 is stored. The lead frame 115b has an anode terminal 115b1. The lead frame 116b has an anode terminal 116b1. The anode terminal 115b1 and one end of the secondary-side winding 113b are connected at the connection portion 208, as shown in FIG. 24. The anode terminal 116b1 and the other end of the secondary-side winding 113b are connected at the connection portion 209. Connection at the connection portions 208, 209 is made by TIG welding, for example. The other components in FIG. 23 are the same as those shown in FIG. 2 in the first embodiment. Therefore, they are denoted by the same reference characters as in FIG. 2 and the description thereof is omitted.

The output terminals 102c1, 104c1 are respectively connected to the lead portions 113a1 at the connection portions 205, 206. The anode terminals 115b1, 116b1 are respectively connected to the ends of the secondary-side winding 113b at the connection portions 208, 209. The switching elements 101 to 104 provided on the primary side and the diodes 115, 116 provided on the secondary side are integrated in one power module 111, whereby the distances between the output terminals 102c1, 104c1 and the anode terminals 115b1, 116b1 are shortened, so that the lead portions 113a1 can be shortened. Since the lead portions 113a1 are shortened, the cost of the primary-side winding 113a can be reduced and the leakage inductance of the transformer 113 can be reduced. Since the leakage inductance of the transformer 113 is reduced, switching loss of the switching elements 101 to 104 can be reduced and surge voltage can be reduced. Thus, the size of the power module 111 can be reduced and the X capacitor 401 can be removed, whereby the size and the cost of the power converter 1 can be further reduced.

In the transformer 113 in the second embodiment, the number of turns of the primary-side winding 113a is larger than the number of turns of the secondary-side winding 113b, and current flowing through the secondary-side winding 113b is greater than current flowing through the primary-side winding 113a. Therefore, the sectional area of the secondary-side winding 113b is larger than the sectional area of the primary-side winding 113a. It is desirable that the anode terminals 115b1, 116b1 and the ends of the secondary-side winding 113b are located so as to be opposed to each other, so that bending work for the secondary-side winding 113b having a larger sectional area is minimized. When the primary-side winding 113a having a smaller sectional area is provided with a bending structure to extend toward the output terminals 102c1, 104c1, it is possible to remove the main circuit patterns from the board 400 and reduce the size and the cost of the board 400, even in a case where the switching elements 101 to 104 provided on the primary side and the diodes 115, 116 provided on the secondary side are integrated in the power module 111. Since the size and the cost of the board 400 are reduced, the size and the cost of the power converter 1 can be reduced.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

Additional Note 1

A power converter comprising:
a board having a power supply terminal portion electrically connected to an external power supply;
a power module having a plurality of switching elements and connected to the power supply terminal portion;
a control circuit which is provided to the board and controls the power module; and
a transformer arranged side by side with the power module and having a winding connected to the power module, wherein
the power module has an input terminal electrically connected to the power supply terminal portion, an output terminal electrically connected to the winding, and a control terminal electrically connected to the control circuit,
the power supply terminal portion and the input terminal are connected via the board, the control circuit and the control terminal are connected via the board, and the winding and the output terminal are connected not via the board,
the winding has a wound portion, and a lead portion extending from the wound portion toward the output terminal and connected to the output terminal, and
a length in the lead portion from a body portion of the transformer in which the wound portion is stored to a connection portion between the output terminal and the lead portion is greater than a length in the output terminal from a body portion of the power module to the connection portion.

Additional Note 2

The power converter according to additional note 1, wherein
the plurality of switching elements include a first switching element and a second switching element,
the first switching element and the second switching element are connected in series to each other, and
a first connection portion at which the first switching element and the second switching element are connected is electrically connected to a first output terminal which is the output terminal.

Additional Note 3

The power converter according to additional note 2, wherein
the plurality of switching elements include a third switching element and a fourth switching element,
the third switching element and the fourth switching element are connected in series to each other, a second connection portion at which the third switching element and the fourth switching element are connected is electrically connected to a second output terminal which is the output terminal, and the first output terminal and the second output terminal are located adjacently to each other.

Additional Note 4

The power converter according to any one of additional notes 1 to 3, wherein the power module is located with a gap provided from a board surface of the board, a direction perpendicular to the board surface and extending from the power module toward the board is defined as a Z direction, and the input terminal extends in the Z direction and is connected to the board.

Additional Note 5

The power converter according to any one of additional notes 1 to 4, wherein the power module is located with a gap provided from a board surface of the board, a direction perpendicular to the board surface and extending from the power module toward the board is defined as a Z direction, and the lead portion has at least one bending portion which is a part bent in the Z direction.

Additional Note 6

The power converter according to any one of additional notes 1 to 5, wherein the power module is located with a gap provided from a board surface of the board, a direction perpendicular to the board surface and extending from the power module toward the board is defined as a Z direction, the lead portion has, on the output terminal side, a bending end which is a part bent in the Z direction and extending in the Z direction, the output terminal has, on the lead portion side, an output bending end which is a part bent in the Z direction and extending in the Z direction, and the bending end and the output bending end are electrically connected so as to form the connection portion.

Additional Note 7

The power converter according to additional note 5, wherein the lead portion protrudes from the body portion of the transformer and then has the bending portion bent in the Z direction or a direction opposite to the Z direction, and the lead portion extends in the Z direction or the direction opposite to the Z direction from the bending portion and then is further bent to extend toward the connection portion.

Additional Note 8

The power converter according to any one of additional notes 1 to 7, wherein the power module is formed in a rectangular parallelepiped shape having a first surface, a second surface on a side opposite to the first surface, and a third surface, a fourth surface, a fifth surface, and a sixth surface which are four surfaces surrounding the first surface and the second surface, the output terminal is located at one of the third surface and the fourth surface opposed to each other, and the lead portion has, at least partially, a part extending obliquely toward the third surface or the fourth surface at which the output terminal is located.

Additional Note 9

The power converter according to any one of additional notes 1 to 8, wherein the power module is formed in a rectangular parallelepiped shape having a first surface, a second surface on a side opposite to the first surface, and a third surface, a fourth surface, a fifth surface, and a sixth surface which are four surfaces surrounding the first surface and the second surface, the input terminal is located at one of the third surface and the fourth surface opposed to each other, the output terminal is located at another of the third surface and the fourth surface opposed to each other, and the transformer is located on the surface side where the output terminal is located.

Additional Note 10

The power converter according to any one of additional notes 1 to 9, further comprising a cooler for cooling the power module, wherein the power module is thermally connected to a cooling surface of the cooler, a board surface of the board is located, with a gap provided from the power module, on a side opposite to the cooler side of the power module, and the connection portion is located in an area between the board and the cooler.

Additional Note 11

The power converter according to any one of additional notes 1 to 10, wherein the power module is located with a gap provided from a board surface of the board, a direction perpendicular to the board surface and extending from the power module toward the board is defined as a Z direction, and as seen in the Z direction, the output terminal and at least a part of the lead portion are located so as to overlap the board, and a length of a part where the lead portion overlaps the board is greater than a length of a part where the output terminal overlaps the board.

Additional Note 12

The power converter according to additional note 6, wherein
the bending end and the output bending end are electrically connected by TIG welding.

Additional Note 13

The power converter according to any one of additional notes 1 to 11, wherein
the output terminal and the lead portion are electrically connected by a screw.

Additional Note 14

The power converter according to additional note 13, wherein
the output terminal extends from the body portion of the power module toward the body portion of the transformer,
the lead portion extends from the body portion of the transformer toward the body portion of the power module,
the connection portion is formed at a part where an end of the output terminal and an end of the lead portion are overlaid on each other, and
the output terminal and the lead portion are fastened by the screw at the connection portion.

Additional Note 15

The power converter according to any one of additional notes 1 to 14, wherein
the transformer has, as the winding, a primary-side winding and a secondary-side winding,
a number of turns of the primary-side winding is larger than a number of turns of the secondary-side winding, and
the output terminal is connected to the primary-side winding.

Additional Note 16

The power converter according to any one of additional notes 1 to 15, wherein
the transformer has, as the winding, a primary-side winding and a secondary-side winding,
the power converter further comprises a rectification circuit which rectifies voltage outputted from the secondary-side winding, and a smoothing circuit which smooths the voltage outputted from the secondary-side winding, and
the rectification circuit is composed of a plurality of semiconductor elements, and the smoothing circuit is composed of a reactor and a capacitor.

Additional Note 17

The power converter according to additional note 16, wherein
the power module is a module in which the plurality of switching elements connected to the primary-side winding of the transformer, and the plurality of semiconductor elements, are integrated.

Additional Note 18

The power converter according to any one of additional notes 1 to 17, wherein
the transformer has, as the winding, a primary-side winding and a secondary-side winding,
the primary-side winding and the secondary-side winding are formed as flat-plate-shaped windings, and
the transformer is a planar-shaped transformer.

DESCRIPTION OF THE REFERENCE CHARACTERS 1, 1a power converter
99 inverter circuit
100, 111 power module
101, 102, 103, 104 switching element
101a, 102a, 103a, 104a gate pad
101b, 102b, 103b, 104b source pad
101c, 102c, 103c, 104c, 14, 115b, 115c, 116b lead frame
101c1, 103c1, 14a input terminal
102c1, 104c1 output terminal
101d, 102d, 103d, 104d, 101e, 102e, 103e, 104e control terminal
115b1, 116b1 anode terminal
115c1 cathode terminal
101f, 102f, 103f, 104f, 101g, 102g, 103g, 104g, 101h, 102h, 103h, 104h, 115f, 116f bonding wire
100x third surface
100y fourth surface
100z1 first surface
100z2 second surface
108 smoothing reactor
109 output capacitor
110 load
113 transformer
113a primary-side winding
113b secondary-side winding
113c body portion
113a1, 113a1-1, 113a1-2 lead portion
113a2 wound portion
114 rectification circuit
115, 116 diode
115a, 116a anode pad
200 DC power supply
201, 202 power supply terminal portion
203 positive-side connection portion
204 negative-side connection portion
205, 206 connection portion
207 control-side connection portion
208, 209 connection portion
210 module connection portion
211 transformer connection portion
212 connection portion
400, 400a board
401 X capacitor
402, 403 Y capacitor
404 fuse
405 current sensor
406 control circuit
10 cooler
10a cooling surface
11 resin
12 cooling plate
13 insulation sheet
15a, 15b length
16a, 16b length
17 oblique portion
18 electrode portion
19 chuck portion
20a bending end 20b output bending end
21, 22 bending portion
23 screw
24 screw reception portion
1000 winding axis
1001 lower core
1002 upper core
1003 winding portion

What is claimed is:

1. A power converter comprising:
a board having a power supply terminal portion electrically connected to an external power supply;
a power module having a plurality of switching elements and connected to the power supply terminal portion;
a control circuit which is provided to the board and controls the power module; and
a transformer arranged side by side with the power module and having a winding connected to the power module, wherein
the power module has an input terminal electrically connected to the power supply terminal portion, an output terminal electrically connected to the winding, and a control terminal electrically connected to the control circuit,
the power supply terminal portion and the input terminal are connected via the board, the control circuit and the control terminal are connected via the board, and the winding and the output terminal are connected not via the board,
the winding has a wound portion, and a lead portion extending from the wound portion toward the output terminal and connected to the output terminal, and
a length in the lead portion from a body portion of the transformer in which the wound portion is stored to a connection portion between the output terminal and the lead portion is greater than a length in the output terminal from a body portion of the power module to the connection portion.

2. The power converter according to claim 1, wherein
the plurality of switching elements include a first switching element and a second switching element,
the first switching element and the second switching element are connected in series to each other, and
a first connection portion at which the first switching element and the second switching element are connected is electrically connected to a first output terminal which is the output terminal.

3. The power converter according to claim 2, wherein
the plurality of switching elements include a third switching element and a fourth switching element,
the third switching element and the fourth switching element are connected in series to each other,
a second connection portion at which the third switching element and the fourth switching element are connected is electrically connected to a second output terminal which is the output terminal, and
the first output terminal and the second output terminal are located adjacently to each other.

4. The power converter according to claim 1, wherein
the power module is located with a gap provided from a board surface of the board,
a direction perpendicular to the board surface and extending from the power module toward the board is defined as a Z direction, and
the input terminal extends in the Z direction and is connected to the board.

5. The power converter according to claim 1, wherein
the power module is located with a gap provided from a board surface of the board,
a direction perpendicular to the board surface and extending from the power module toward the board is defined as a Z direction, and
the lead portion has at least one bending portion which is a part bent in the Z direction.

6. The power converter according to claim 1, wherein
the power module is located with a gap provided from a board surface of the board,
a direction perpendicular to the board surface and extending from the power module toward the board is defined as a Z direction,
the lead portion has, on the output terminal side, a bending end which is a part bent in the Z direction and extending in the Z direction,
the output terminal has, on the lead portion side, an output bending end which is a part bent in the Z direction and extending in the Z direction, and
the bending end and the output bending end are electrically connected so as to form the connection portion.

7. The power converter according to claim 5, wherein
the lead portion protrudes from the body portion of the transformer and then has the bending portion bent in the Z direction or a direction opposite to the Z direction, and
the lead portion extends in the Z direction or the direction opposite to the Z direction from the bending portion and then is further bent to extend toward the connection portion.

8. The power converter according to claim 1, wherein
the power module is formed in a rectangular parallelepiped shape having a first surface, a second surface on a side opposite to the first surface, and a third surface, a fourth surface, a fifth surface, and a sixth surface which are four surfaces surrounding the first surface and the second surface,
the output terminal is located at one of the third surface and the fourth surface opposed to each other, and
the lead portion has, at least partially, a part extending obliquely toward the third surface or the fourth surface at which the output terminal is located.

9. The power converter according to claim 1, wherein
the power module is formed in a rectangular parallelepiped shape having a first surface, a second surface on a side opposite to the first surface, and a third surface, a fourth surface, a fifth surface, and a sixth surface which are four surfaces surrounding the first surface and the second surface,
the input terminal is located at one of the third surface and the fourth surface opposed to each other,
the output terminal is located at another of the third surface and the fourth surface opposed to each other, and
the transformer is located on the surface side where the output terminal is located.

10. The power converter according to claim 1, further comprising a cooler for cooling the power module, wherein
the power module is thermally connected to a cooling surface of the cooler,
a board surface of the board is located, with a gap provided from the power module, on a side opposite to the cooler side of the power module, and
the connection portion is located in an area between the board and the cooler.

11. The power converter according to claim 1, wherein
the power module is located with a gap provided from a board surface of the board,
a direction perpendicular to the board surface and extending from the power module toward the board is defined as a Z direction, and
as seen in the Z direction,
the output terminal and at least a part of the lead portion are located so as to overlap the board, and
a length of a part where the lead portion overlaps the board is greater than a length of a part where the output terminal overlaps the board.

12. The power converter according to claim 6, wherein the bending end and the output bending end are electrically connected by TIG welding.

13. The power converter according to claim 1, wherein the output terminal and the lead portion are electrically connected by a screw.

14. The power converter according to claim 13, wherein
the output terminal extends from the body portion of the power module toward the body portion of the transformer,
the lead portion extends from the body portion of the transformer toward the body portion of the power module,
the connection portion is formed at a part where an end of the output terminal and an end of the lead portion are overlaid on each other, and
the output terminal and the lead portion are fastened by the screw at the connection portion.

15. The power converter according to claim 1, wherein
the transformer has, as the winding, a primary-side winding and a secondary-side winding,
a number of turns of the primary-side winding is larger than a number of turns of the secondary-side winding, and
the output terminal is connected to the primary-side winding.

16. The power converter according to claim 3, wherein
the transformer has, as the winding, a primary-side winding and a secondary-side winding,
the power converter further comprises a rectification circuit which rectifies voltage outputted from the secondary-side winding, and a smoothing circuit which smooths the voltage outputted from the secondary-side winding, and
the rectification circuit is composed of a plurality of semiconductor elements, and the smoothing circuit is composed of a reactor and a capacitor.

17. The power converter according to claim 16, wherein the power module is a module in which the plurality of switching elements connected to the primary-side winding of the transformer, and the plurality of semiconductor elements, are integrated.

18. The power converter according to claim 1, wherein
the transformer has, as the winding, a primary-side winding and a secondary-side winding,
the primary-side winding and the secondary-side winding are formed as flat-plate-shaped windings, and
the transformer is a planar-shaped transformer.

* * * * *